(12) United States Patent
Sasou et al.

(10) Patent No.: US 7,506,742 B2
(45) Date of Patent: Mar. 24, 2009

(54) BOARD UNLOADING DEVICE AND BOARD UNLOADING METHOD

(75) Inventors: Haruji Sasou, Hirakata (JP); Hiroki Omura, Hirakata (JP)

(73) Assignee: C. Uyemura & Co., Ltd., Osaka (JP)

( * ) Notice: Subject to any disclaimer, the term of this patent is extended or adjusted under 35 U.S.C. 154(b) by 236 days.

(21) Appl. No.: 11/580,616

(22) Filed: Oct. 13, 2006

(65) Prior Publication Data
US 2007/0098537 A1    May 3, 2007

(30) Foreign Application Priority Data
Oct. 14, 2005  (JP)  ............................. 2005-300255
Sep. 20, 2006  (JP)  ............................. 2006-254759

(51) Int. Cl.
*B65G 43/00*  (2006.01)
*B65G 23/24*  (2006.01)
*B65G 1/00*  (2006.01)

(52) U.S. Cl. ........................ 198/340; 198/329; 198/338; 198/339; 198/341

(58) Field of Classification Search ................. 198/329, 198/338–341, 347.2
See application file for complete search history.

(56) References Cited

U.S. PATENT DOCUMENTS

| 4,888,200 A | * | 12/1989 | Milliken ..................... 427/478 |
| 6,062,799 A | * | 5/2000 | Han et al. .............. 414/416.07 |
| 6,244,641 B1 | * | 6/2001 | Szapucki et al. ........... 294/64.1 |
| 6,682,629 B2 | * | 1/2004 | Kudo et al. ............. 156/345.32 |

FOREIGN PATENT DOCUMENTS

JP    2002-363796    12/2002

\* cited by examiner

*Primary Examiner*—Gene Crawford
*Assistant Examiner*—Yolanda Cumbess
(74) *Attorney, Agent, or Firm*—Hamre, Schumann, Mueller & Larson, P.C.

(57) ABSTRACT

A board unloading device is provided that can simplify unloading task and can be used to unload and pile a thin board. A board dropper unlocks clamping of the board in fallen condition of a transport hanger. A board container receives and houses the board when the board has fallen vertically. By activating a rotate cylinder, the board container is rotated. A transport roller carries out the board horizontally from an open area of the rotated board container.

17 Claims, 28 Drawing Sheets

_US 7,506,742 B2_

BOARD UNLOADING DEVICE AND BOARD UNLOADING METHOD

CROSS REFERENCE TO RELATED APPLICATIONS

The entire disclosure of Japanese Patent Applications No. 2005-300255 and No. 2006-254759 including specification, claims, drawings and summary are incorporated herein by reference in its entirety.

FIELD OF THE INVENTION

The present invention relates to the skill which is used for a surface treatment device, like electroplating, to unload and transport a transport hanger.

BACKGROUND ART

At first, referring to FIGS. 7 and 8, the structure of a surface treatment device which is comprised of the board unloading device will be described as follows. FIG. 7 shows plane view of the surface treatment device 100 from upside. FIG. 8 shows side view of the surface treatment device 100 from α-direction.

FIGS. 7 and 8 shows the plating device of so-called pusher type as the surface treatment device 100, and having such that the transport hanger 15 which is holding the board such as a printed board, rise-and-fall guide rails 10, 12 which rise and fall with the slidable transport hanger 15, and fixed guide rails 11, 13 which transport the transport hangers 15 sequentially while keeping each predetermined space of backward and forward.

As shown in FIG. 7, pre-treatment tank 1 of each type for processing before plating, plating tank 2 for electroplating, recovery tank 3 and water-washing tank 4 for processing after plating, unload section 5 that is arranged the board unloading device for unloading a board, exfoliate tank 6 for separating plating films, water-washing tank 7 for water-washing the transport hanger 15 after separating, and load section 8 for loading a board, are arranged along these guide rails 10-13.

Rise-and-fall guide rails 10, 12 shown in FIG. 7 are guide rails which rise and fall when loading or unloading the board W (such as printed board), and when dipping the board W into various type of tanks (e.g., plating tank 2, exfoliate tank 6, water-washing tank, and hot water-washing tank). Fixed guide rails 11, 13 are guide rails respectively for transporting the transport hanger 15 which has fallen into plating tank 2, exfoliate tank 6, etc. When Rise-and-fall guide rails 10, 12 has fallen as shown in FIG. 8, guide rails 10-14 configure one circular guide rail.

Referring to FIG. 9 and FIG. 10, the structure of conventional transport hanger 15 transported by the surface treatment device 100 will be described as follows. FIG. 9 shows detail structure of the transport hanger 15. FIG. 10 shows partial cross-section near the center of the transport hanger 15.

As shown in FIG. 9, the transport hanger 15 has treating-object holding member 90 with plural clamps 48 for holding the treating-object W, slide member 35 which contact sidably with guide rails such as fixed guide rail 11, and connecting members 44 for connecting such members.

As shown in FIG. 9, the treating-object holding member 90 has horizontal rods 46 which are continuously connected with the connecting member 44 and extended to nearly-horizontal in transporting direction, plural drooping rods 49 which are placed on the predetermined position of the horizontal rod 46, and clamp 48 which clamps the board on lower end of the drooping rod 49.

As shown in FIG. 10, the clamp 48 is comprised of fixed part 48a and movable part 48b. The movable part 48b is rotatably attached to the axis of the fixed part 48a. The clamp 48 is activated by a spring to close tip end of the fixed part 48a and the movable part 48b in normal condition. As the clearance is made on tip of the fixed part 48a and the movable part 48b by pressing the top edge of movable part 48b against spring force, therefore it becomes possible to insert the board W into the clearance.

The board unloading device 5' placed in unload section 5 is, as shown in FIG. 1l, comprised of a clamp opener 50, a hanger supporter 51, and a container 53.

The clamp opener 50 is configured by attaching a clamp press member on tip of a press cylinder, and when the transport hanger 15 of FIG. 7 arrived above the unload section 5 has fallen with Rise-and-fall guide rails 12 as shown in FIG. 11, the press cylinder of the clamp opener 50 is activated to unlock clamping by expanding and pressing the top edge of movable part 48b of clamp 48 (FIG. 10). The hanger supporter 51 is configured by attaching a support plate on tip of support cylinder, and supports the treating-object holding member 90 of the above-mentioned transport hanger 15 which has fallen, before activating the clamp opener 50, by activating the support cylinder to expand and contacting the support plate from the opposite side of the clamp opener 50. Therefore, it is possible to prevent from weakening the press force caused by bending the treating-object holding member 90 of the transport hanger 15. The container 53 is placed at downside of the transport hanger 15 fallen with rise-and-fall guide rail 12, further receives and houses the dropping board which is unlocked clamping.

The board unloading device 5', which is comprised of the clamp opener 50 and the hanger supporter 51 and the container 53, activate the transport hanger 15 clamping the board W falling with Rise-and-fall guide rail 12 to drop into the container 53 when unlocking the clamp by a clamp opener 50 and a hanger supporter 51, and after that it will be carried and piled by worker (Refer to the Japanese Laid open Patent Application No. 2002-363796).

However, the above-mentioned conventional board unloading device 5' has the following type of problems.

It was so troublesome and bothering task for worker to pile the board W dropped into the container 53 shown in FIG. 11. And, as surface tension occurred from treatment liquid sit on the surface of the board W and claggy plating made the board W not to separate from clamp 48 when unlocking clamp, it caused the device to stop operation in some cases. Furthermore, it occurred that the upper part of the board W (which is not adequately housed by the container 53) was bent when the board is thin such as below 0.1 mm thick, because the board W stuck to the container 53 while dropping by the above-mentioned surface tension.

SUMMARY OF THE INVENTION

As to solve the above problems, an object of the present invention is to provide a board unloading device which can unload a board easily.

(1) In accordance with characteristics of the present invention, there is provided a board unloading device comprising:

a board dropper for unlocking the board clamping of the transport hanger;

a board carrier having a board container, wherein the board carrier rotates the board container and carries out the board from an open area of the board container, after receiving and housing the board which is unloaded by the board dropper from the transport hanger vertically through the open area.

Therefore, it becomes possible to automate the board unloading task, and to pile easily by connecting to well known conveyor of horizontal transport type or buildup device.

(2) In accordance with characteristics of the present invention, there is provided a board unloading device:

wherein the board carrier carries out the board housed in board container after rotating from the open area by a board transporter.

Therefore, it becomes possible to carry out the board automatically and smoothly from the board container.

(3) In accordance with characteristics of the present invention, there is provided a board unloading device:

wherein the said board container having cutout on lower sidewall when the board container has rotated; and wherein the said board transporter upholds the board housed in board container through the cutout after rotating and carries out the board from the open area.

Therefore, it becomes possible to prevent the board from bending when carrying out as the board is totally supported. Furthermore, as it becomes possible to carry out the board quickly, consequently the board can be auto-unloaded smoothly even if the surface treatment device transports a large number of transport boards in a unit time (more productive).

(4) In accordance with characteristics of the present invention, there is provided a board unloading device:

wherein the said board carrier having a board supporter which adjusts a drop position of the board unloaded from the transport hanger.

Therefore, it becomes possible to prevent even different sized board from getting scratched when dropping into the board container.

(5) In accordance with characteristics of the present invention, there is provided a board unloading device:

wherein the said board dropper having a board unsticker.

Therefore, it becomes possible to prevent from stopping the device's operation based on problems that the board is not separated from clamp etc. caused by surface tension occurs from treatment liquid sit on the surface of the board.

(6) In accordance with characteristics of the present invention, there is provided a board unloading device:

wherein the said board container having cutouts on both lower and upper sidewalls when the board container has rotated; and wherein an air sprayer sprays air on both sides of the board through the said cutouts, when the board dropper unlocks the board clamping of the transport hanger.

Therefore, it becomes possible to prevent the board from sticking to the sidewall of the container while dropping.

(7) In accordance with characteristics of the present invention, there is provided a board unloading device:

wherein the said air sprayer sprays air against at least above the lower end of the board.

Therefore, it becomes possible to prevent the board from sticking to the sidewall of the container while dropping certainly.

(8) In accordance with characteristics of the present invention, there is provided a board unloading device:

wherein the said board container having a stick-on prevention guide on its inner surface.

Therefore, it becomes possible to prevent the board from sticking to the sidewall of the container while dropping.

(9) In accordance with characteristics of the present invention, there is provided a board unloading method for a board unloading device:

unloading the board by unlocking the board clamping of the transport hanger;

rotating the board container and carrying out the board from an open area of the board container, after receiving and housing the board which is unloaded from the transport hanger vertically through the open area.

Therefore, it becomes possible to automate the board unloading task, and to pile easily by connecting to well known conveyor of horizontal transport type or buildup device.

The characteristics of the present invention are broadly indicated as noted above, but structure, contents, object, and features will be clear though reference to the figures and according to the following disclosure.

BRIEF DESCRITION OF THE DRAWINGS

DETAILED DESCRIPTION OF DESIRED EMBODIMENTS

1. The Structure of the Board Unloading Device

Figure 1:
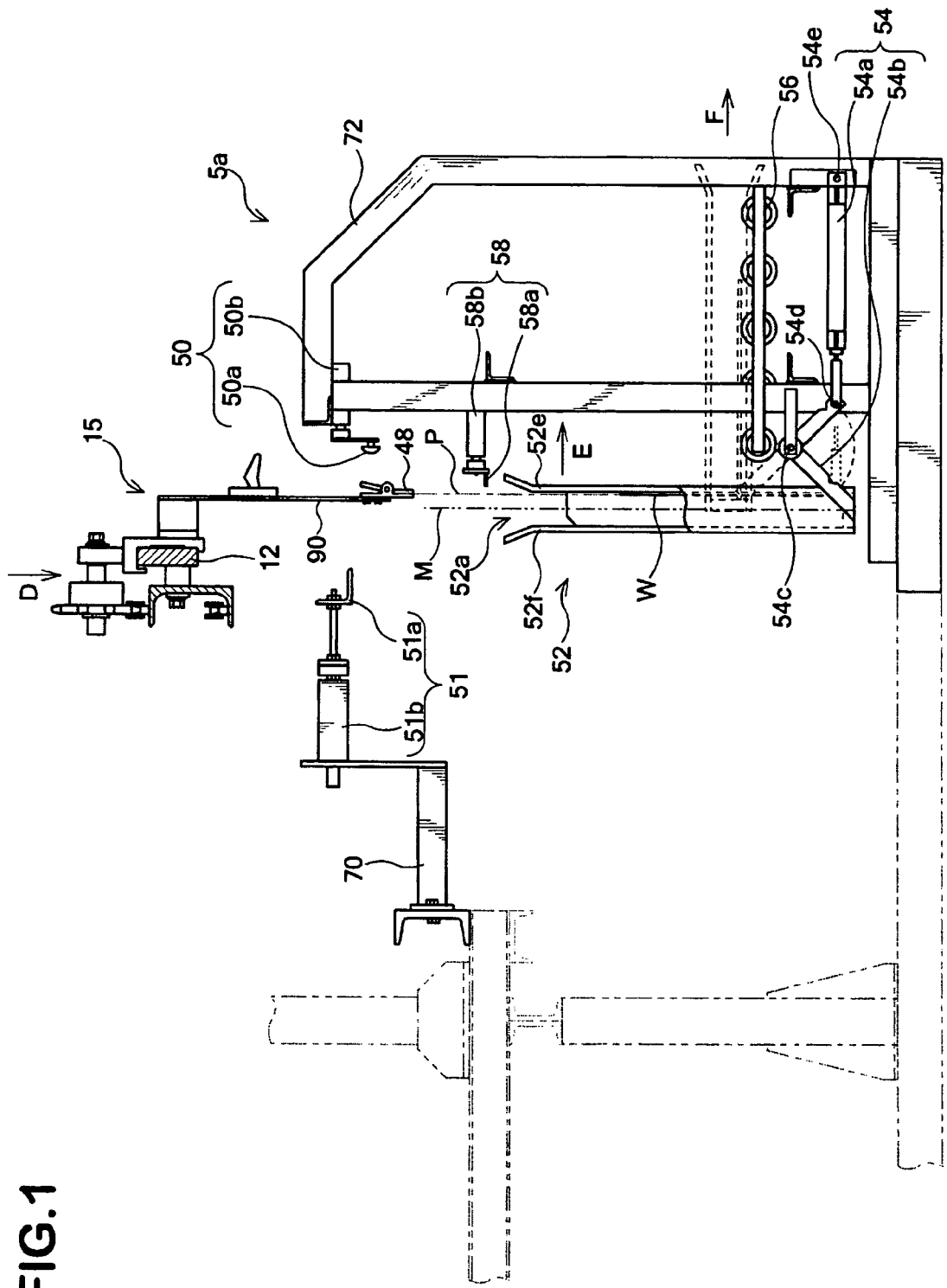
FIG. 1 shows the structure of the board loading device.

FIG. 1 shows the structure of the board unloading device (the unloader 5*a*). Furthermore, the unloader 5*a* shown in FIG. 1 is placed in the position of the unload section 5 which comprises the surface treatment device 100 shown in FIG. 7 as mentioned below.

The unloader 5*a* is the device for unloading the board W from the transport hanger clamping of it, and is used for unloading task which is to unload the board W from the transport hanger and after that to pile (build up) it.

As shown in FIG. 1, the unloader 5*a* is comprised of a board dropper having a hanger supporter 51 attached to the base frame 70 and a clamp opener 50 and a board unsticker 58 attached to the base frame 72, and a board carrier having a board container 52 (partially cut out) and a rotator 54 and a board transporter 56. The board dropper unlocks clamping of the board W by the transport hanger and drops the board W into the board container 52. Furthermore, the board carrier carry out the board W, which is unloaded from the transport hanger by the board dropper and housed by dropping vertically, after rotating in horizontal condition. Also, the base frame 70 and 72 are made of steel product.

First, referring to FIG. 1, the board dropper will be described, which is comprised of the hanger supporter 51, the clamp opener 50, and the board unsticker 58 as below.

As shown in FIG. 1, the hanger supporter 51 is comprised of support plate 51*a* and support cylinder 51*b*. The hanger supporter 51 supports the transport hanger 15 by contacting the treating-object holding member 90 from left side of drawing in condition that the transport hanger 15 has fallen with rise-and-fall guide rail 12 as shown in FIG. 1.

Specifically, before a clamp opener 50 described below unlock the clamp 48, the support cylinder 51*b* actuates the support plate 51*a* to support the transport hanger 15. Therefore, it is possible to prevent the treating-object holding member 90 of the transport hanger 15 from bending etc. when unlocking the clamp 48 and to unlock the clamp 48 certainly.

As shown in FIG. 1, the clamp opener 50 is comprised of clamp press member 50*a* and press cylinder 50*b* placed at right side the transport hanger 15. The clamp opener 50 unlocks the clamp 48 of the transport hanger 15 clamping the board W in condition that the transport hanger 15 has fallen with rise-and-fall guide rail 12 as shown in FIG. 1.

Specifically, after the support cylinder 51*b* of the hanger supporter 51 shown in FIG. 1 actuates the support plate 51*a* to support the transport hanger 15 and contacts with the transport hanger 15, press cylinder 50*b* actuates the clamp press member 50*a* to press the top edge of movable part 48*b* for unlocking the clamp of the board W in that condition.

The board unsticker 58 is comprised of board press member 58*a* and press cylinder 58*b* shown in FIG. 1. After unlocking the clamp 48 by the above-mentioned clamp opener 50, the board unsticker 58 drops the board W into the board container 52 certainly by moving back and forth horizontally around an open area of the board container 52. For example, sometimes the board W doesn't drop or sticks to inside sidewall 52*e* of the board container 52 even when the clamping is unlocked caused by surface tension occurred from treatment liquid sit on the surface of the board W and claggy plating. Even if such a case, it is possible to swing and drop the board W by contacting the board press member 58*a* with the board W (for instance, compress a few mm) and making an impact. In the above, although the number of contacting the board press member 58*a* with the board W is only one time, but it is possible for dropping the board W certainly to move back and forth plural times until a sensor, which is attached to around the bottom of the board container 52, has detected that the board W has already dropped.

Figure 13A:
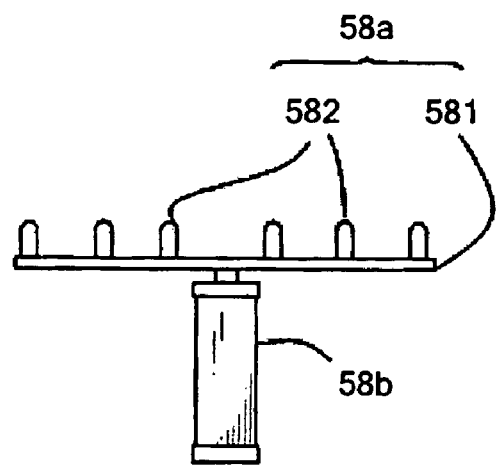
FIG. 13 shows the structure of the board unsticker.

FIG. 13A shows plane view of the board unsticker 58 from upside. As shown in FIG. 13A, the board press member 58*a* of the board unsticker 58 is comprised of the plate member 581 attached to the press cylinder 58*b* and six projection members 582 for compressing and contacting with the board W. The projection members 582 are made of plastic (PP: Polypropylene) and shaped its end roundly. This is for the projection member 582 not to scratch the board W when pressing it.

Figure 13B:
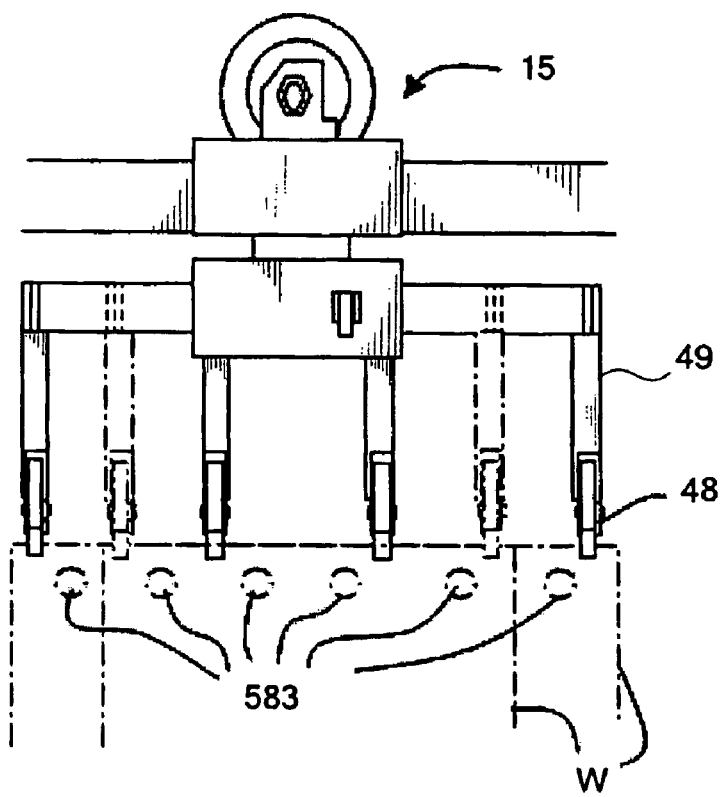

FIG. 13B shows the positional relationship between the projection members 582 of the board unsticker 58, and the transport hanger 15, the board W. As shown in FIG. 13B, the projection members 582 of the board unsticker 58 is placed at downside (for instance, a few mm downside) of the clamp 48 of the transport hanger 15, and presses at contact position 583 where is more inside than both sides of the clamp 48. This is for that reason, to transfer the press operation to the board W precisely and to resolve the problem caused by surface tension occurred from treatment liquid sit on the surface of the board W and claggy plating even if such a thin board as thickness is below 1 mm. Furthermore, although the contact position 583 shown in FIG. 13B of the projection members 582 is desirable to be close to around the clamp 48 for dropping the board W certainly, additionally if it is needed for the board W not to be stuck to the board container 52, the contact position 583 can be apart from around clamp 48 (at midway of adjacent clamps 48) to swing the board W widely.

Then, referring to FIG. 2 etc, the board carrier will be described which is comprised of the board container 52, the rotator 54, and the board transporter 56 shown in FIG. 1 as below. Furthermore, FIG. 2 shows the structure of the board container 52, and the board container 52 is made of PVC (polyvinyl chloride) in this embodiment.

Figure 2:
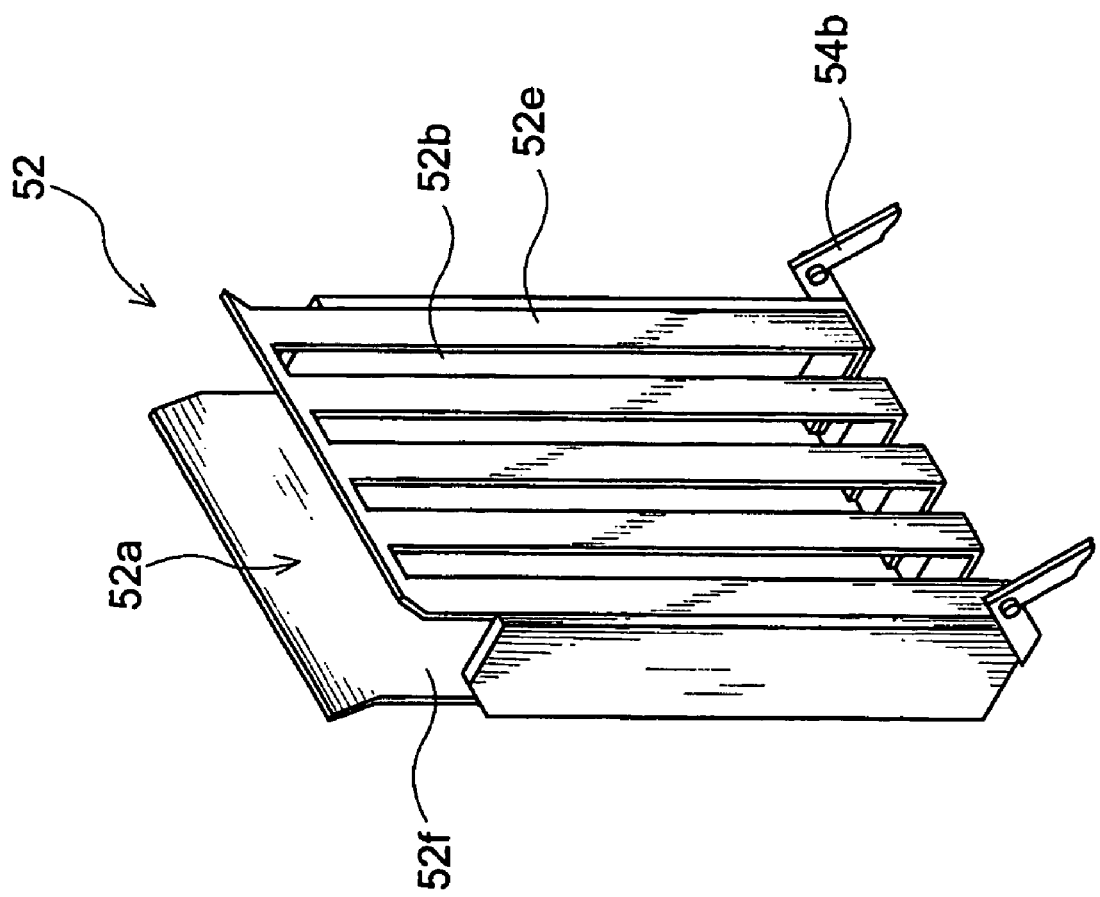
FIG. 2 shows perspective view of the board container 52 of FIG. 1.

The board carrier has the board container 52 which is connected to the rotator 54 in order to rotate in E-direction around the rotational axis 54*c* shown in FIG. 1, and has longitudinally-extending cutouts 52*b* on its sidewall 52*e* as shown in FIG. 2.

When the board container 52 has rotated in horizontal condition (indicated as dotted line in FIG. 1), the transport roller 56 shown in FIG. 1, i.e. the board transporter, is guided through the cutout 52*b* (refer to FIG. 2) inwardly. Therefore, the transport roller 56 (the board transporter) upholds the board W which is housed in the board container 52 in horizontal condition made by the rotator 54 through the cutout 52*b* not to touch the board W on the sidewall 52*e* and aftermentioned stick-on prevention guide 52*d* (refer to FIG. 3C) as shown FIG. 3A, B. Furthermore, FIG. 3A shows side view of rotated board container 52, and FIG. 3B shows bottom view of rotated board container 52.

Figure 3A:
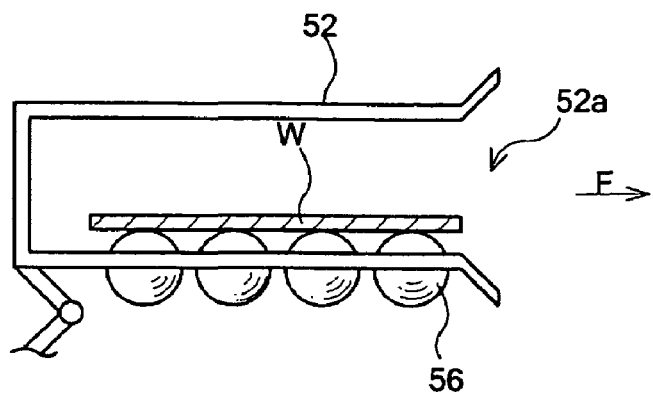
FIG. 3A shows side view of rotated board container 52.
Figure 3B:
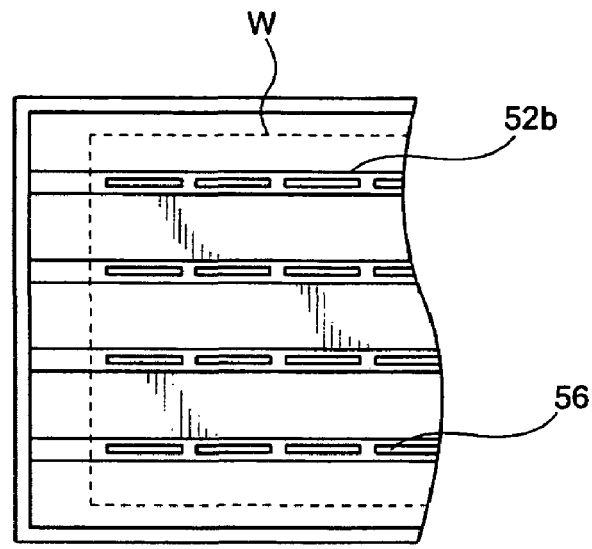
FIG. 3B shows bottom view of rotated board container 52.

Thus, by forming cutout of the board container 52 as shown in FIG. 2, it becomes possible to make the board W supported condition by the transport roller 56 through the cutout 52*b* of the board container 52 as shown in FIG. 3B and to transport the board W in F-direction shown in FIG. 3A smoothly. For example, the board W is supported, as the transport roller 56 projects the sidewall 52e of the board container 52 approx. 10 mm.

Also, as shown in FIG. 1, the board container 52 is having an open area 52a for receiving the board W when the transport hanger 15 has fallen vertically (D-direction in FIG. 1), and the open area 52a is formed to be expanded widely toward the upper side to receive the board W into the board container 52 certainly.

Also, as shown in FIG. 1, the board container 52 is placed at such a position, that P location of the clamp 48 comprising the transport hanger 15 is closer to inner surface of the sidewall 52e than M location where is middle of the board container 52 (e.g. 10-50 mm from inner surface of the sidewall 52e), and built to receive and house the board W along the inner surface of the sidewall 52e of the board container 52. Therefore, the board W housed in the board container 52 is prevented from scratching by moving when the board container 52 is rotated in E-direction of FIG. 1.

Figure 3C:
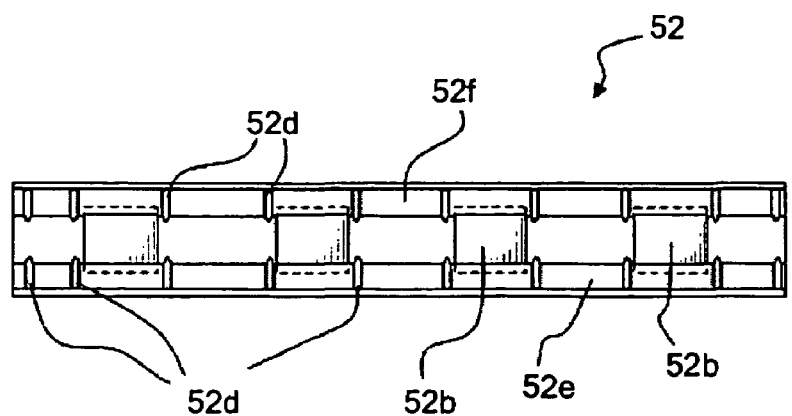
FIG. 3C shows upper view of open area of the board container 52.

Moreover, as shown in FIG. 3C, stick-on prevention guides 52d made of PVC are formed longitudinally in the shape of stick (a few mm in diameter) on inner surface of the sidewall 52e, 52f of the board container 52 by adhering it on whole sidewall 52e, 52f. FIG. 3 shows the open area 52a of the board container from upside when the board container 52 is in solid line condition in FIG. 1. Therefore, as proximal contact is not occurred between the board W and inner surface of the sidewall 52e, 52f, it becomes possible to prevent scratching on the board W and sticking to the inner surface of the sidewall 52e, 52f caused by surface tension occurred from treatment liquid sit on the surface.

Figure 4:
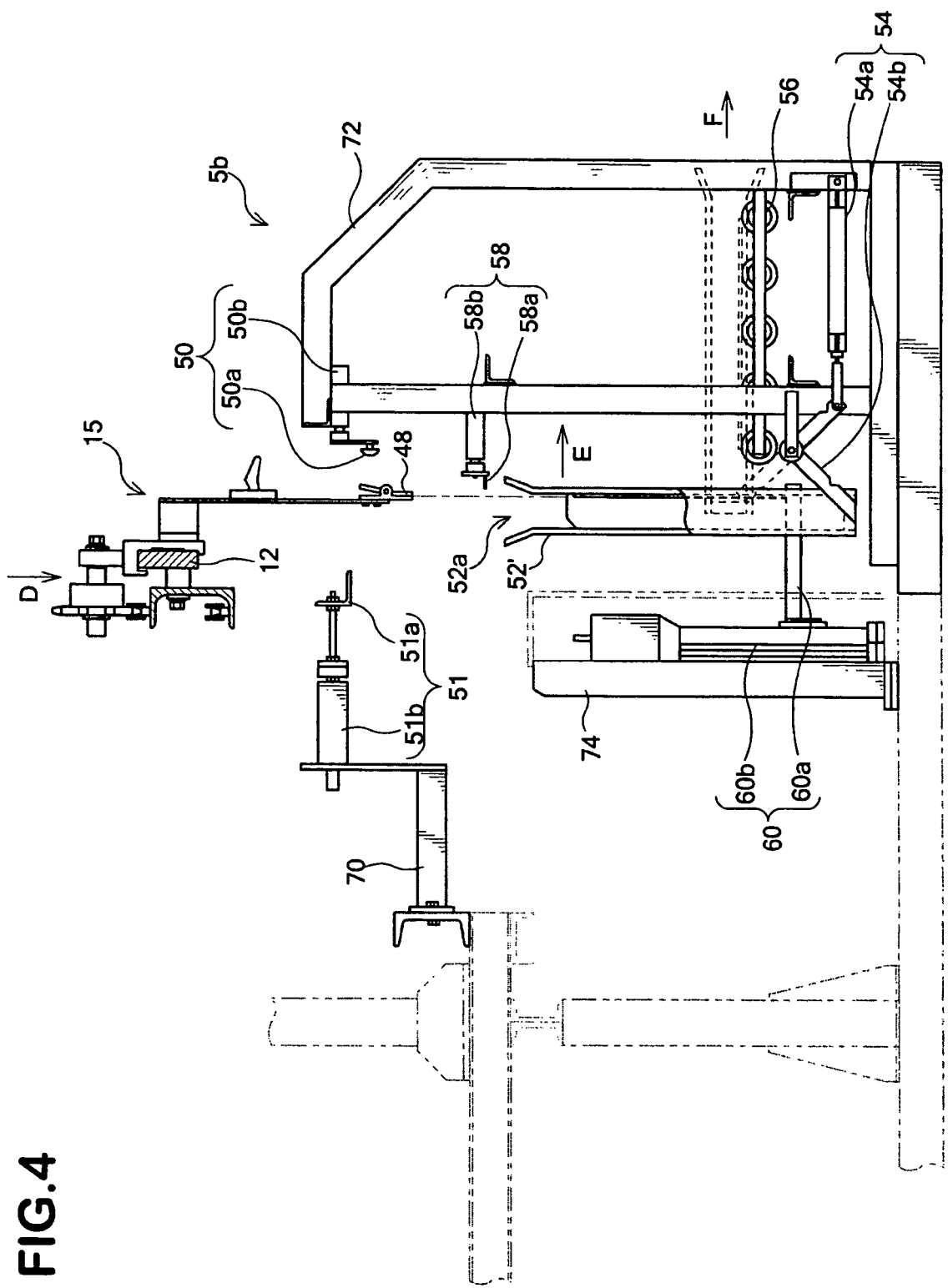
FIG. 4 shows the structure of unloader 5b having the board supporter 40.

As shown in FIG. 4, the rotator 54 is comprised of rotate cylinder 54a to supply rotating power to the board container 52, and rotate arm 54b which is unified member of L style to transfer the power of the rotate cylinder 54a to the board container 52, by connecting one end to the lower part of the board container 52 and connecting the other end to rotate cylinder 54a. By activating the rotate cylinder 54a to expand and rotating the rotate arm 54b around the axis 54c fixed to the base frame 72, the board container 52 is rotated in E-direction of FIG. 1 while housing the board W. Moreover, one end of the rotate cylinder 54a is connected to the base frame 72 with axis 54e rotatably, and the other end is connected rotatably to the axis 54d, which is fixed to the rotate arm 54b of the board container 52.

The board transporter is comprised of the transport roller 56, and carries out the board W, which is housed in the rotated board container 52 as indicated by dotted line of FIG. 1, horizontally (F-direction of FIG. 1) from the open area. For instance, diameter of the transport roller 56 is 40 mm. Because, if the diameter of roller is too big, it may be occurred that tip of the board W thrust into between the transport rollers 56 and make some trouble when transporting. Furthermore, the rotation axis is at lower position than rotated board container 52.

Figure 22:
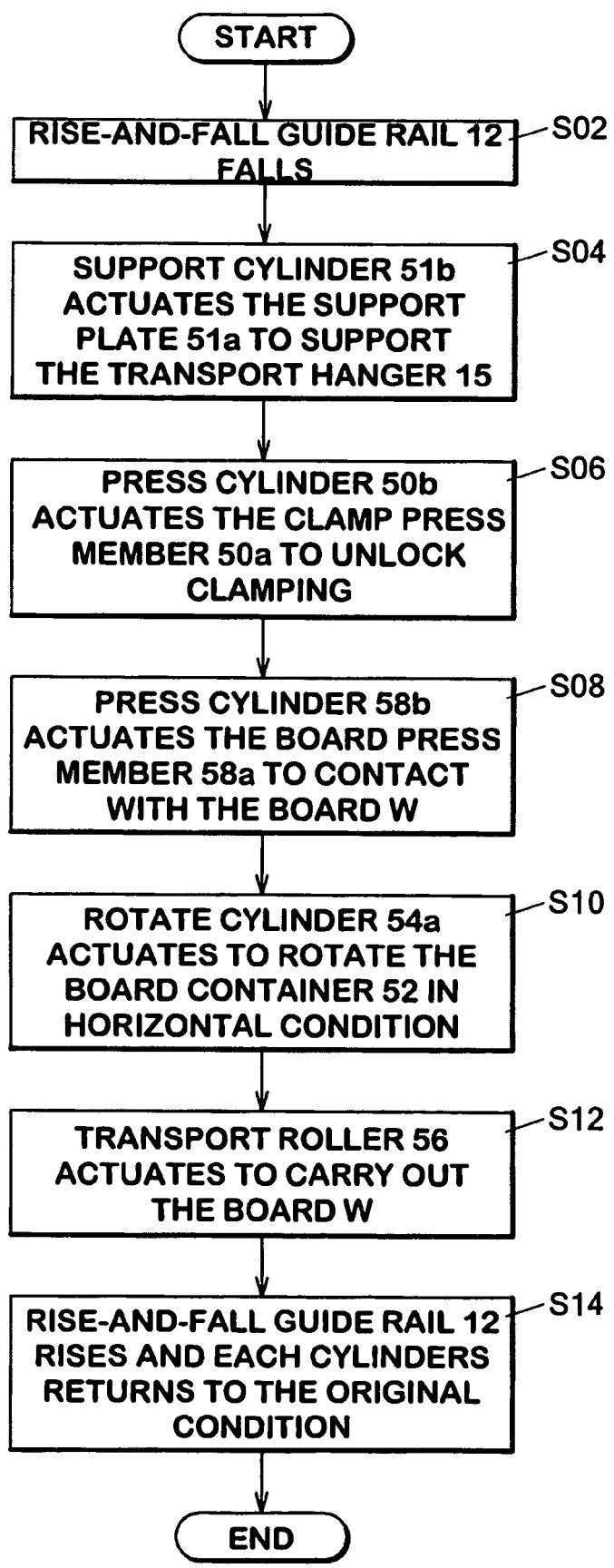
FIG. 22 shows the control flowchart of the board loading.

Referring to FIG. 22, the control flowchart at unloader 5a will be described. Furthermore, the movement of unloader 5a is controlled by the control part of the electroplating device 100 (FIG. 7), which is comprised of CPU (not illustrated), for example.

Figure 7:
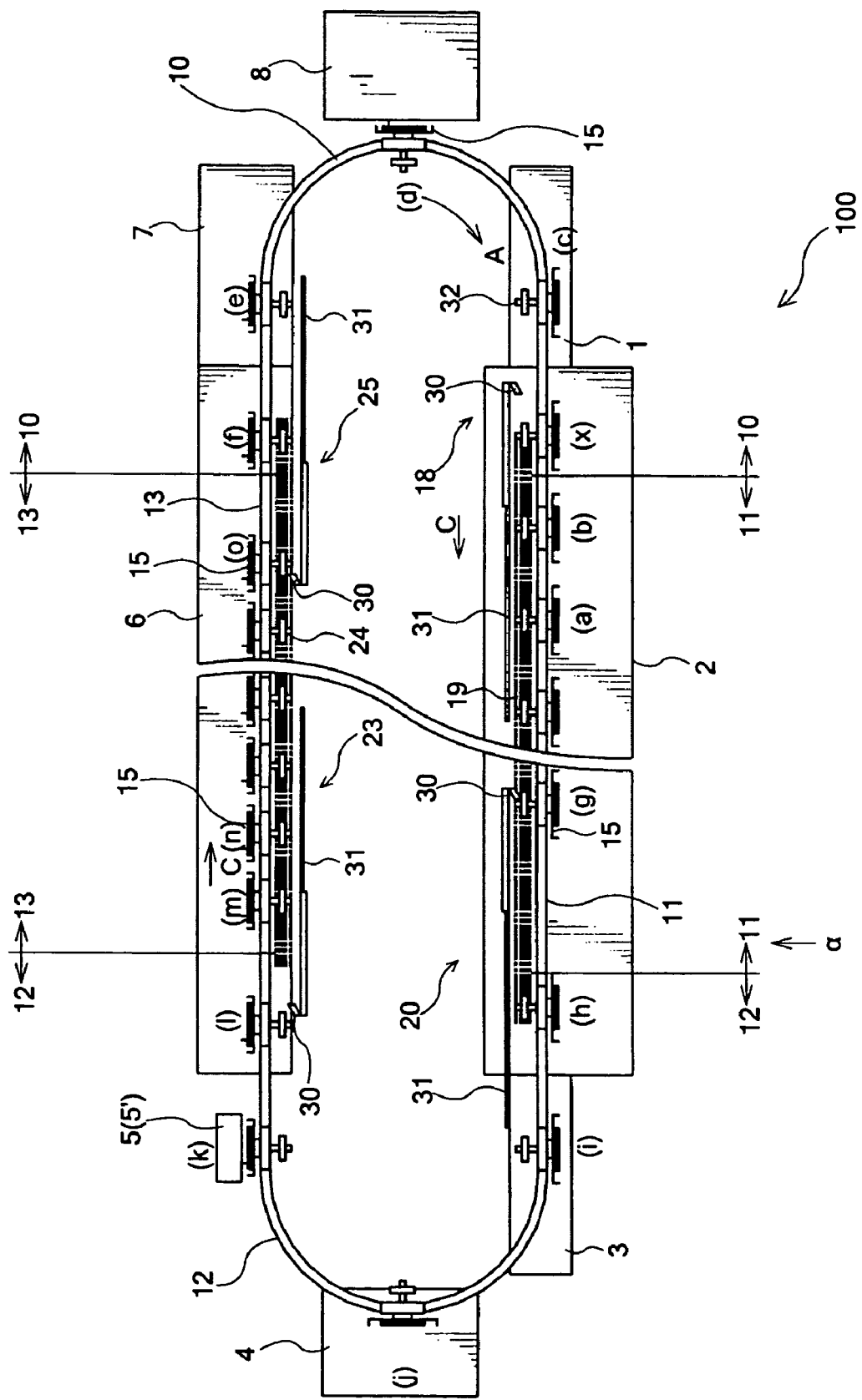
FIG. 7 shows plane view of surface treatment device 100 from upside.

When a sensor (not illustrated) has detected that the transport hanger 15 holding the board W arrived at unload section 5 from water washing tank 4 of the electroplating device 100 shown in FIG. 7, by the control part's command, the rise-and-fall guide rail 12 falls in D-direction as shown in FIG. 22 (step S02).

Secondly, when the predetermined time has passed based on measure by a timer etc. since the above detection of the sensor, the support cylinder 51b shown in FIG. 1 actuates the support plate 51a to support the transport hanger 15 by contacting with the treating-object holding member 90, by the control part's command (step S04). After that, when the predetermined time has passed still more, the press cylinder 50b actuates the clamp press member 50a to unlock clamping by pressing the top edge of the clamp 48 (step S06).

Further, when the predetermined time has passed, the press cylinder 58b actuates the board press member 58a to contact with the board W (step S08). Besides, if the board W has already dropped when the clamping of the board W by clamp 48 is unlocked (the above step S06), the board press member 58a doesn't contact with the board W while the press cylinder 58b is actuated.

When the board W is housed in the board container 52 (e.g. detect by a sensor attached to the board container 52), the rotate cylinder 54a actuates to rotate the board container 52 around the rotational axis 54c shown in FIG. 1 in E-direction and the board container 52 is maintained in horizontal condition (step S10). When the board container 52 became in horizontal condition, the transport roller 56 starts rolling to carry out the board W in F-direction shown in FIG. 1 (step S12).

After transferring the board W, the rise-and-fall guide rail 12 rises and each cylinder (the support cylinder 51b, the press cylinder 50b, press cylinder 58b, the rotate cylinder 54a) returns to the original condition.

After that, the transport hanger 15 that the board W has unloaded is transferred to exfoliate tank 6 shown in FIG. 7. On the other hand, a new transport hanger 15 holding the board W is transferred to unload section 5 from water-washing tank 4, and a series of the operation (step S02-S14 in FIG. 22) is done by unloader 5a.

Also, on the control flowchart shown in FIG. 22, though the press cylinder 58b was controlled activating when the predetermined time has passed in step S08 after unlocking the clamping of the board W (step S06), it is possible to rotate the board container 52 without activating the press cylinder 58b when the dropping of the board W has detected by a sensor attached to the board container 52, or to actuate the press cylinder 58b only when a sensor which is attached to the board container 52 is not detect the dropping of the board W.

As described above, it becomes possible to achieve the following, as the unloader 5a of the present invention is comprised of the board dropper having the clamp opener 50 the hanger supporter 51 and the board unsticker 58, and the board carrier having the board container 52 and the rotator 54 and the transport roller 56.

(i) By connecting the transport roller 56 to well known pile (build up) device, it becomes possible to automate the board unloading task. Also, as the board W is carried out by the board transporter 56, it becomes possible to receive and pile the board W easily for worker.

(ii) By having the board unsticker 58, it becomes possible to prevent from that the board is not dropped into the board container 52 caused by surface tension occurs from treatment liquid sit on the surface of the board. Therefore, it is averted that the risk by stopping the device or product failure such as the thin board W not housed smoothly is bended.

2. The Structure of the Surface Treatment Device and the Transport Hanger

Figure 8:
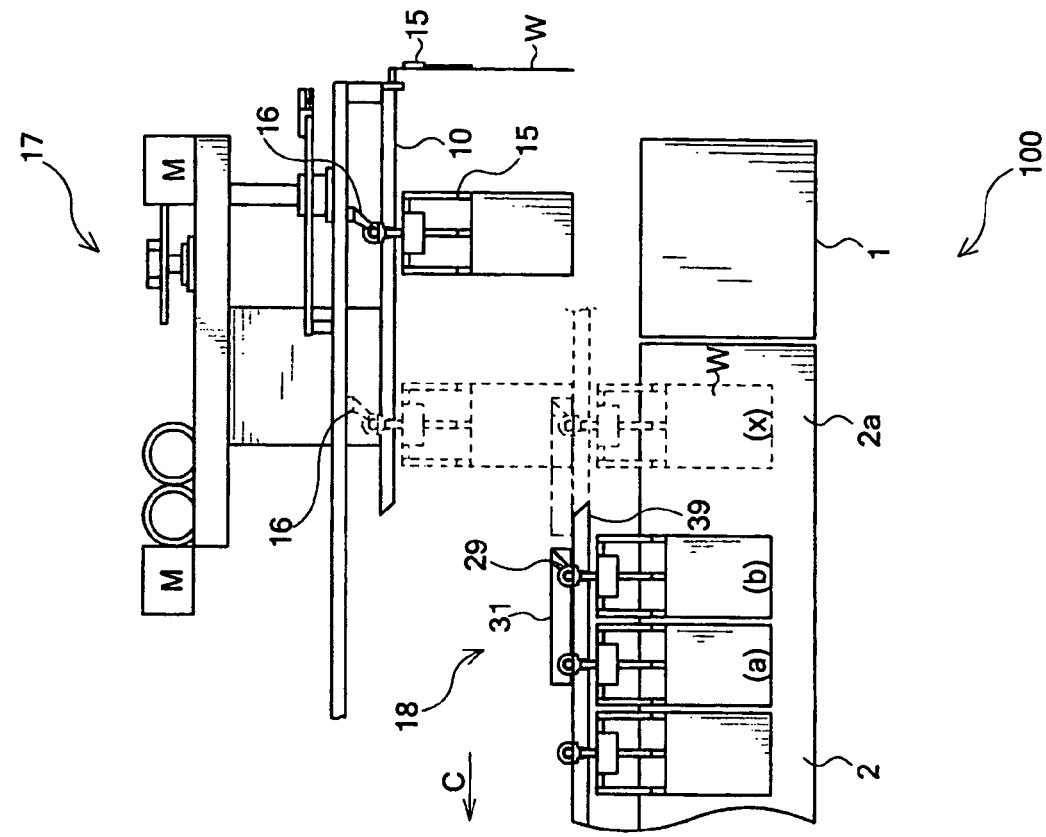
FIG. 8 shows side view of surface treatment device 100 from α-direction.
Figure 8:
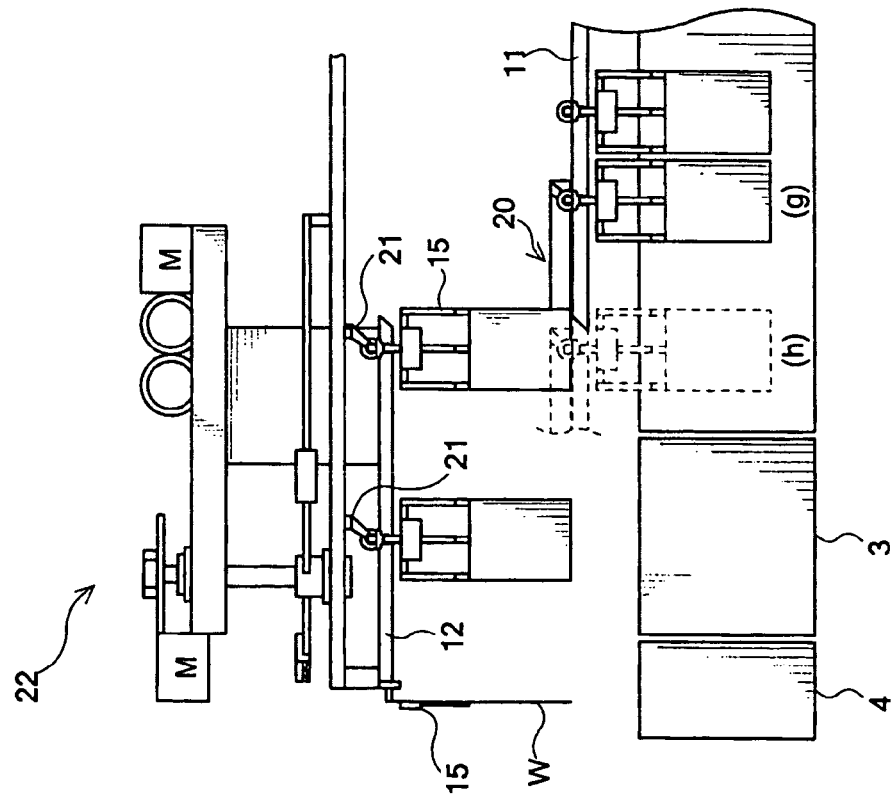

The structure of the surface treatment device applying the unloader 5a of the present invention is the same as shown in FIGS. 7 and 8.

As shown in FIG. 7 and FIG. 8, the surface treatment device 100 is the plating device of so-called pusher type, and comprised of the transport hanger 15 which is holding the board such as a printed board, rise-and-fall guide rails 10, 12 which rise and fall with the slidable transport hanger 15, and fixed guide rails 11, 13 which transport the transport hanger 15 sequentially while keeping each predetermined space of backward and forward, and further the pre-treatment tank 1 of each type for processing before plating, plating tank 2 for electroplating, recovery tank 3 and water-washing tank 4 for processing after plating, unload section 5 that is arranged the board unloading device for unloading a board, exfoliate tank 6 for separating plating films, water-washing tank 7 for water-washing the transport hanger 15 after separating, and load section 8 for loading a board are arranged along these guide rails 10-13. As shown in FIG. 7 and FIG. 8, rise-and-fall guide rails 10, 12 shown in FIG. 7 are guide rails for transport the transport hanger 15 intermittently which rise and fall when loading or unloading the board W (such as printed board), and when dipping the board W into various type of tanks (e.g., plating tank 2, exfoliate tank 6, water-washing tank, and hot water-washing tank).

Figure 9:
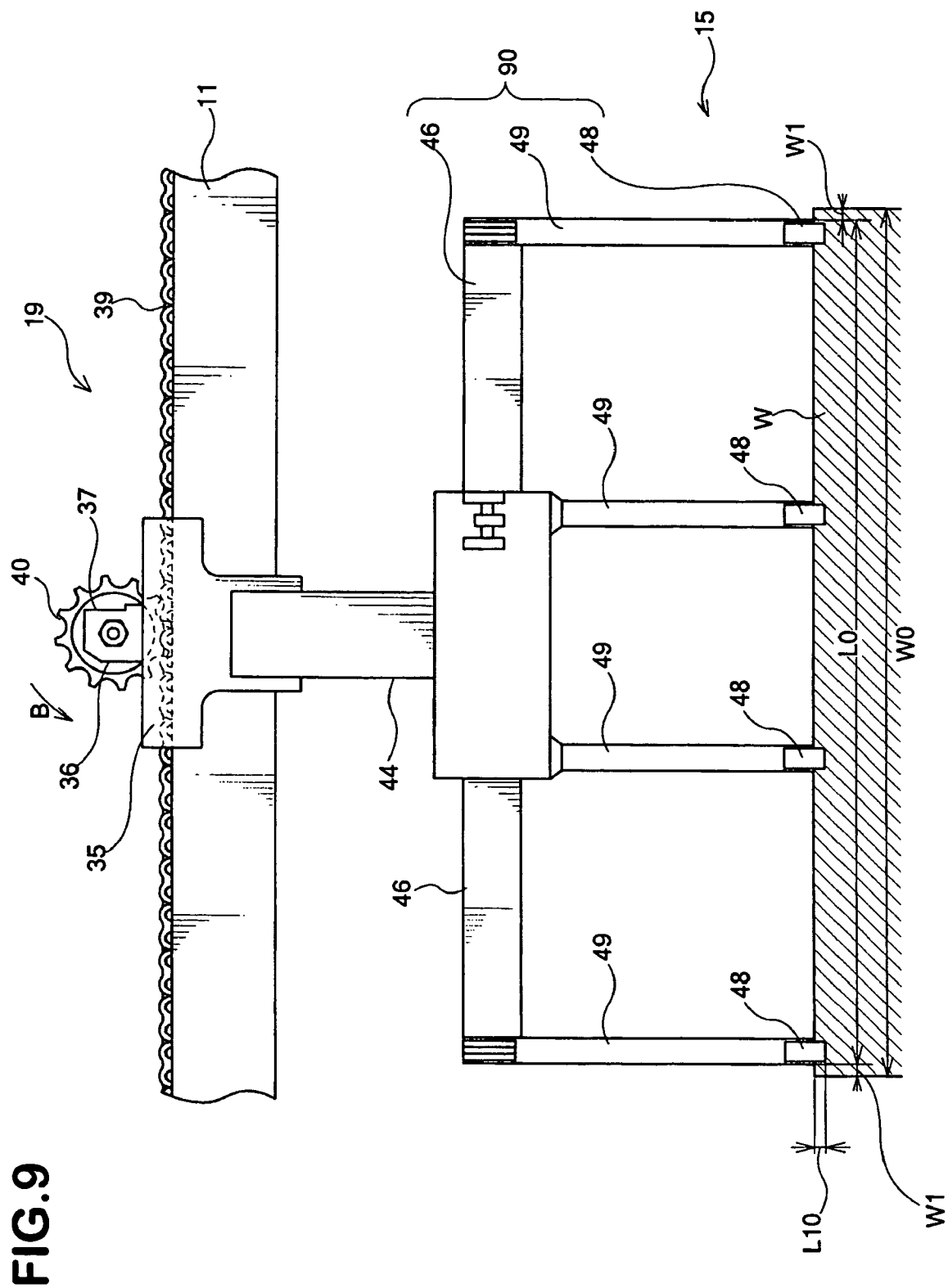
FIG. 9 shows detail structure of the transport hanger 15.
Figure 10:
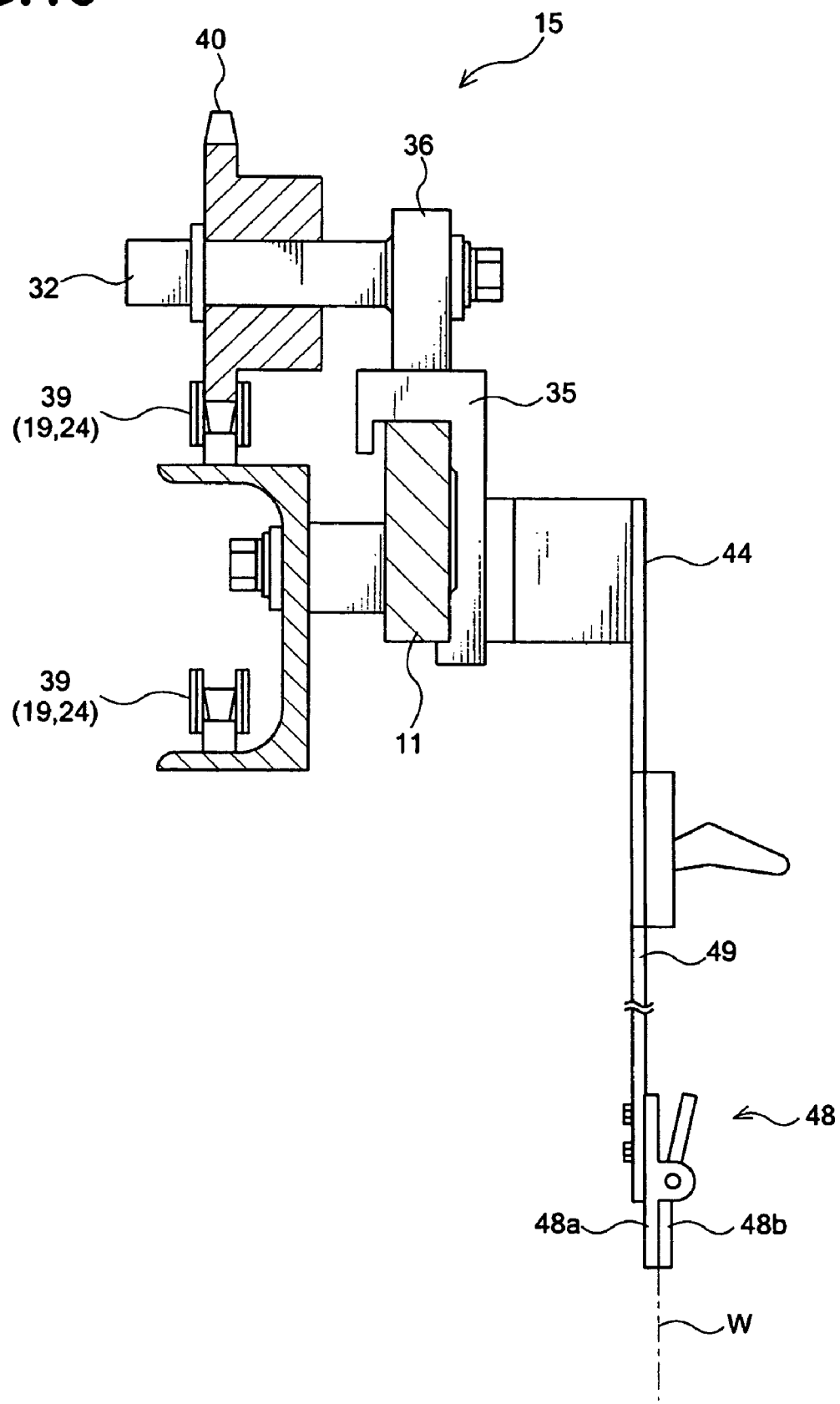
FIG. 10 shows partial cross-section near the center of the transport hanger 15
Figure 11:
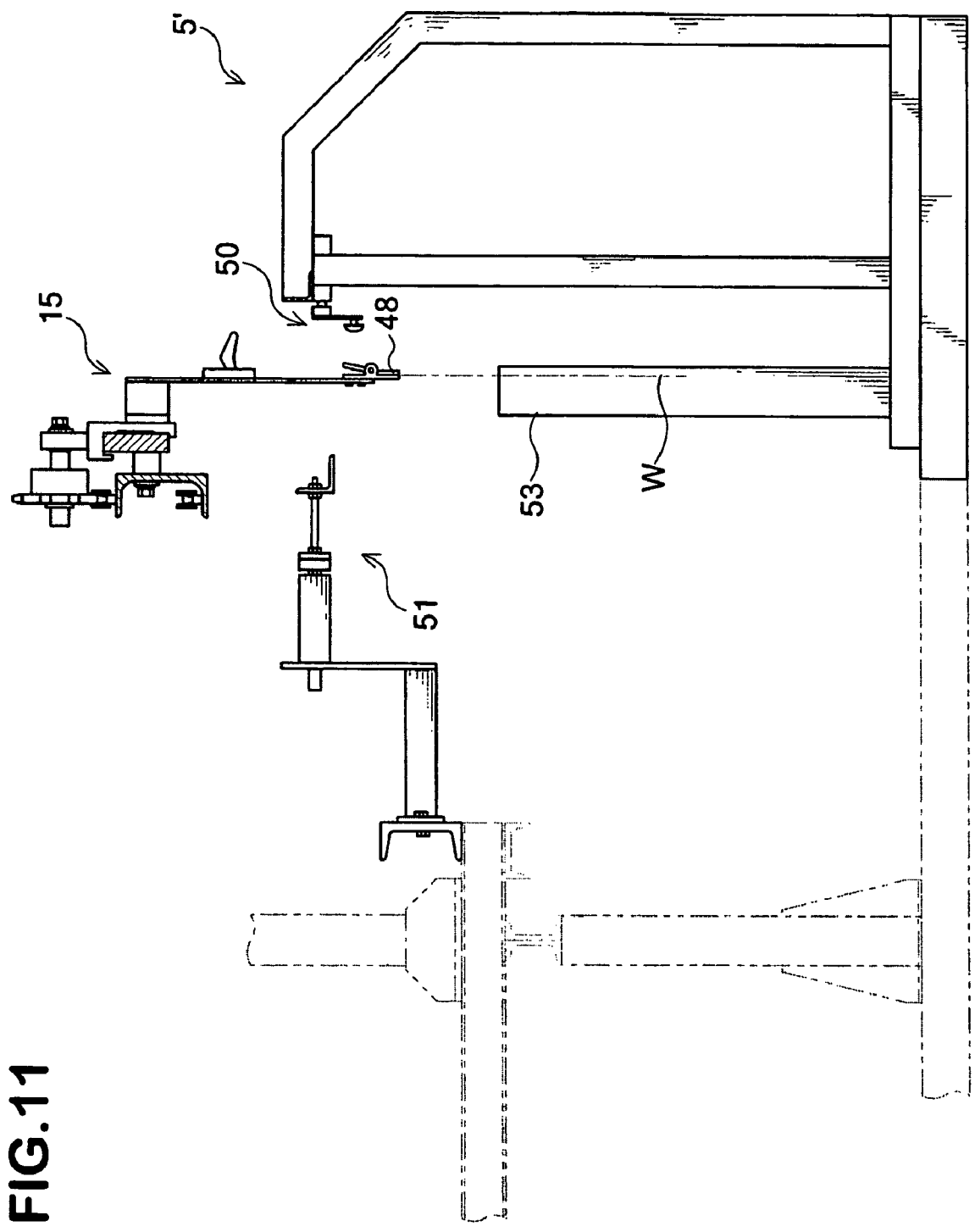
FIG. 11 shows the structure of prior board loading device (unloader 5') in other embodiment.

Referring to FIG. 9 and FIG. 10, the structure of the transport hanger 15 will be described.

As shown in FIG. 9, the transport hanger 15 has treating-object holding member 90 with plural clamps 48 for holding the treating-object W, slide member 35 which contact sidably with guide rails such as fixed guide rail 11, and connecting members 44 for connecting such members. Copper and brass are used for the material of the slide member 35 and connecting members 44.

As shown in FIG. 10, a bearing 36 which has the gear 40 adjusting together with chain belt 39 (comprising the fixed guide rail transporter 19 in FIG. 7) of one-way clutch type is fixed on the slide member 35. Therefore, the gear 40 which adjusts together with chain belt 39 on the fixed guide rail 11, 13 can rotate only in B-direction shown in FIG. 9 when feeding forward.

Figure 12:
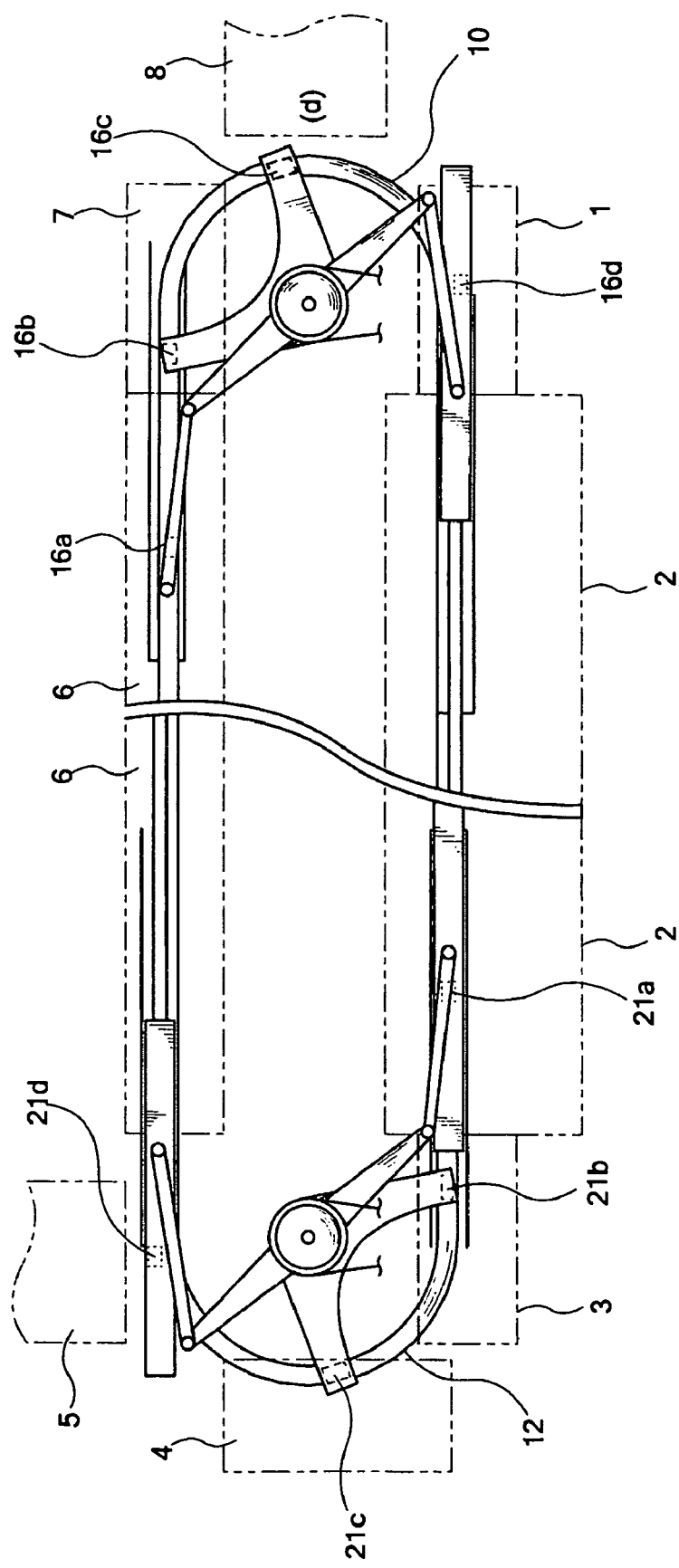
FIG. 12 shows the structure of the intermittent transporter 17 on the rise-and-fall guide rail 10.

Also, by contacting the pusher 16, 21 (FIG. 8) of intermittent transporter 17, 22 with the pusher contacting face 37 shown in FIG. 9, the transport hanger 15 is transported. For instance, as the pusher 21c of the intermittent transporter 22 shown in FIG. 12 presses the contacting face 37 of the transport hanger 15 placed at j-position of FIG. 7, the transport hanger 15 is transferred to the unloader 5a (k-position of FIG. 7). FIG. 12 shows plane view of the intermittent transporter 17, 22, which is arranged above the rise-and-fall guide rail 10, 12

The nail-hooking part 32 of FIG. 10 is a part contacted by the transport nail 30 (FIG. 7) of positioning transporter 18 for transporting the transport hanger 15.

3. The Other Embodiment

Also, in the embodiment described above, it was described that the board container 52 receives a dropped board W at its bottom position (refer to FIG. 1), but the present invention is not limited thereto. For example, as shown in FIG. 4, it is possible to add board supporter 60 to the board carrier, and to receive the dropped board W by the board supporter 60 in a board container 52', and further to configure adjustable a drop position of the board W. Unloader 5b of FIG. 4 is different from unloader 5a of FIG. 1 in that having the board supporter 60 attached to the base frame 74. Furthermore, the base frame 74 is made of steel product.

As shown in FIG. 4, the board supporter 60 is comprised of board stopping member 60a for receiving the dropped board W, and stop-position adjust lift 60b that relocate the board stopping member 60a at predetermined position of height by drive of motor or electric actuator.

Concretely speaking, before the above-mentioned clamp opener 50 unlocks the clamp 48, in response to vertical length of the board W that the transport hanger 15 holds shown in FIG. 4, the stop-position adjust lift 60b activate board stopping member 60a to transfer at predetermined height (for example, the height position is at least longer distance than margin L10 (FIG. 10) from low end of the board W for clamp 48: height position 10-30 mm is desirable from low end of the board W), and after that the lower end of dropped board W is supported around bottom of the board container 52'. Therefore, it becomes possible to prevent the board W from getting scratched when dropping into the board container 52' effectively.

Figure 5:
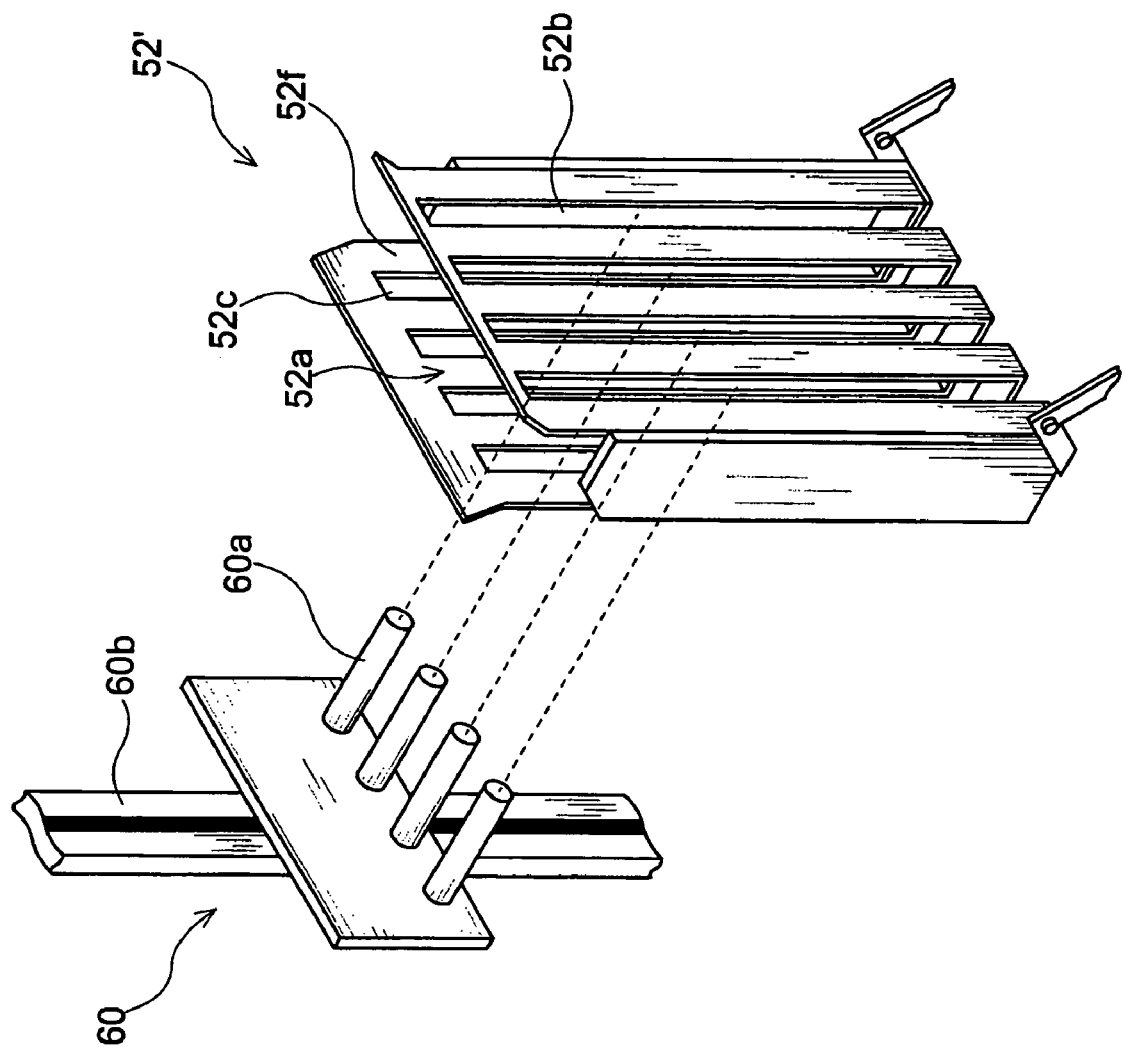
FIG. 5 shows the structure of the board supporter 60 and the board container 52.

FIG. 5 shows the structure of the board supporter 60 and the board container 52' in this embodiment. As shown in FIG. 5, the board stopping member 60a is comprised of plural rods expanded perpendicularly, and the board container 52' having not only cutout 52b of the sidewall 52e but also cutout 52c of the sidewall 52f to let these rods to penetrate the board container 52'.

Figure 14:
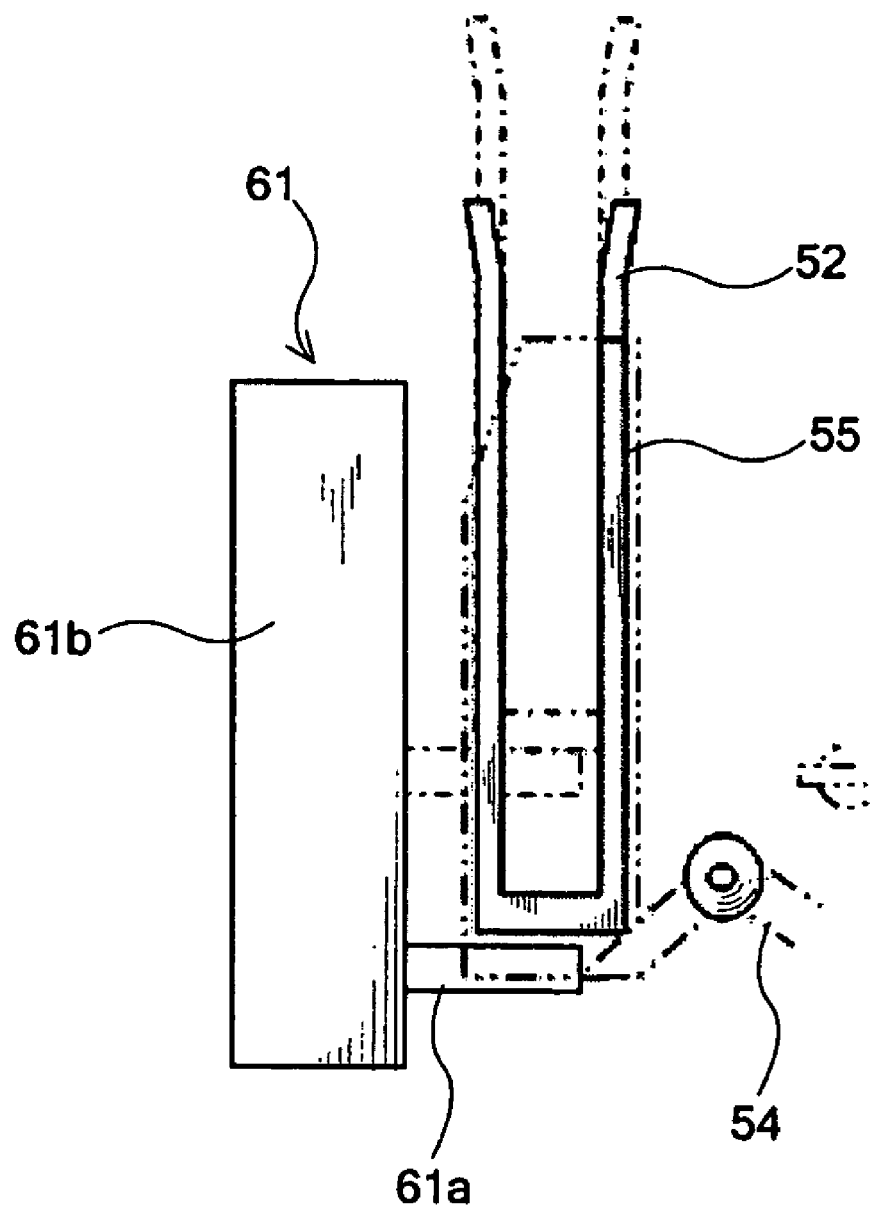
FIG. 14 shows the structure of the board loading device in other embodiment.

Also, in the embodiment described above, it was described that the board stopping member 60a, which penetrate the board container 52' through the cutout 52b, c of sidewall 52e, f, is used to adjust a drop position of the board W as shown in FIG. 5, but the present invention is not limited thereto. For example, as shown in FIG. 14, the position can be adjusted by fixing the rotator 54 to a board container platform 55, and putting the board container 52 (without cutout 52c of sidewall 52f as well as board container 52 shown in FIG. 1) on the board container platform 55 movably up and down, and transferring a container support member 61 up and down which is attached to container position adjusting lift 61b.

Also, in the embodiment shown in FIG. 4, it was described that to adjust a dropping position of the board W when housing in the board container 52, the stop-position adjust lift 60b actuates the board stopping member 60a for receiving the dropped board W, but the present invention is not limited thereto. For example, the stop-position adjust lift 60b can be excluded.

Figure 15:
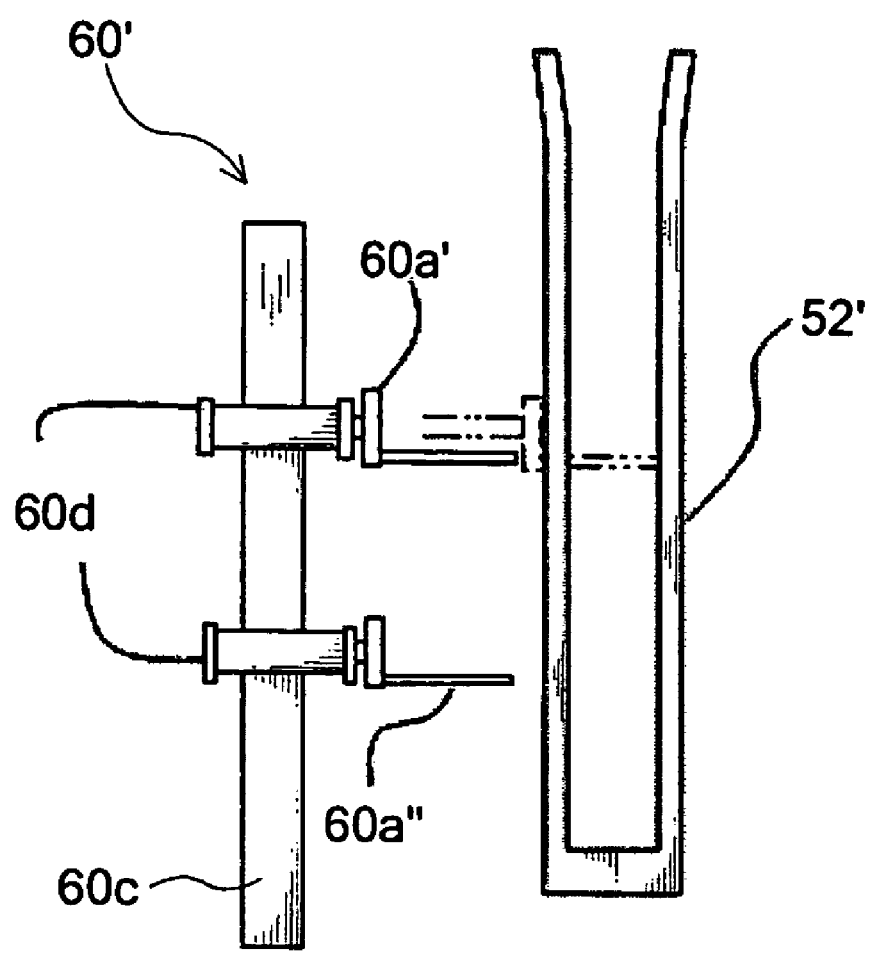
FIG. 15 shows the structure of the board loading device in other embodiment.

For example, as shown in FIG. 15, it can be configured by attaching the two board stopping member 60' and 60" to the adjust cylinder 60d, fixing them at predetermined height of the fixing member 60c respectively beforehand, expanding stopping member 60' or 60" in response to the size of the board W when dropping the board W, and penetrating the board container 52' through cutout 52c.

Furthermore, as the board supporter 60' shown in FIG. 15 applies for the unloading device, the board supporter 60' can be put in place of the board supporter 60 shown in FIG. 4 with deleting the base frame 74.

Also, in the embodiment described above, it was described that the board is received closer to inner surface of the sidewall 52e vertically as shown in FIG. 1, but the present invention is not limited thereto. For example, the board can be received apart from inner surface of the sidewall 52e (for instance, around middle of the open area 52a shown in FIG. 1).

Figure 6:
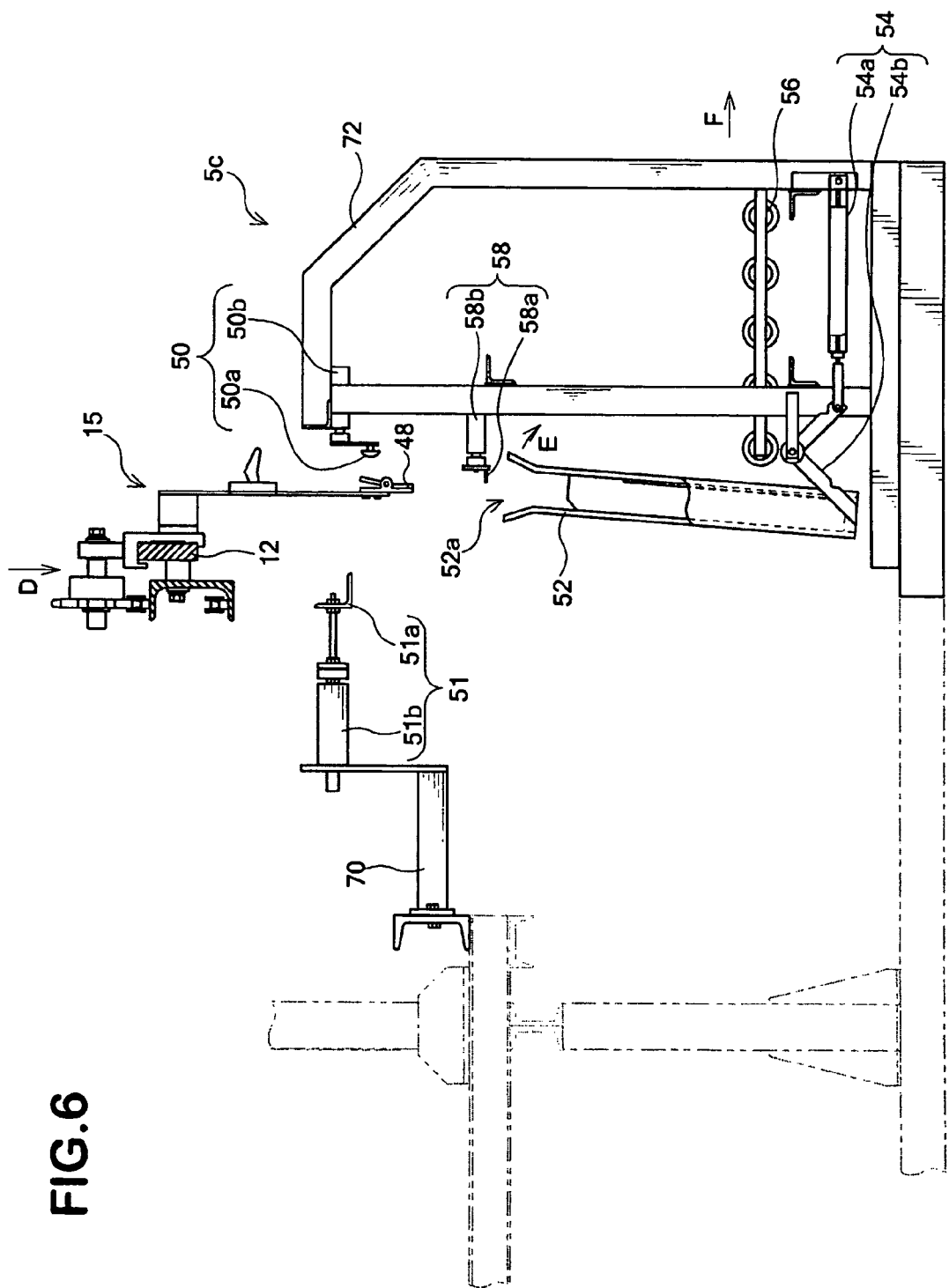
FIG. 6 shows the structure of unloader 5c in other embodiment.

Also, in the embodiment described above, it was described that the board container 52 is configured vertically as shown in FIG. 1, but the present invention is not limited thereto. For example, the board container 52 can be configured on the lean as shown in FIG. 6, and can receive the board W vertically in the condition.

Also, in the embodiment described above, it was described that the board W is carried out by the board transporter 56 having driving source after rotating by rotator 54 in horizontal position as shown in FIG. 1, but the present invention is not limited thereto. For example, a free roller which is a board transporter without driving source can be used for it.

Figure 16:
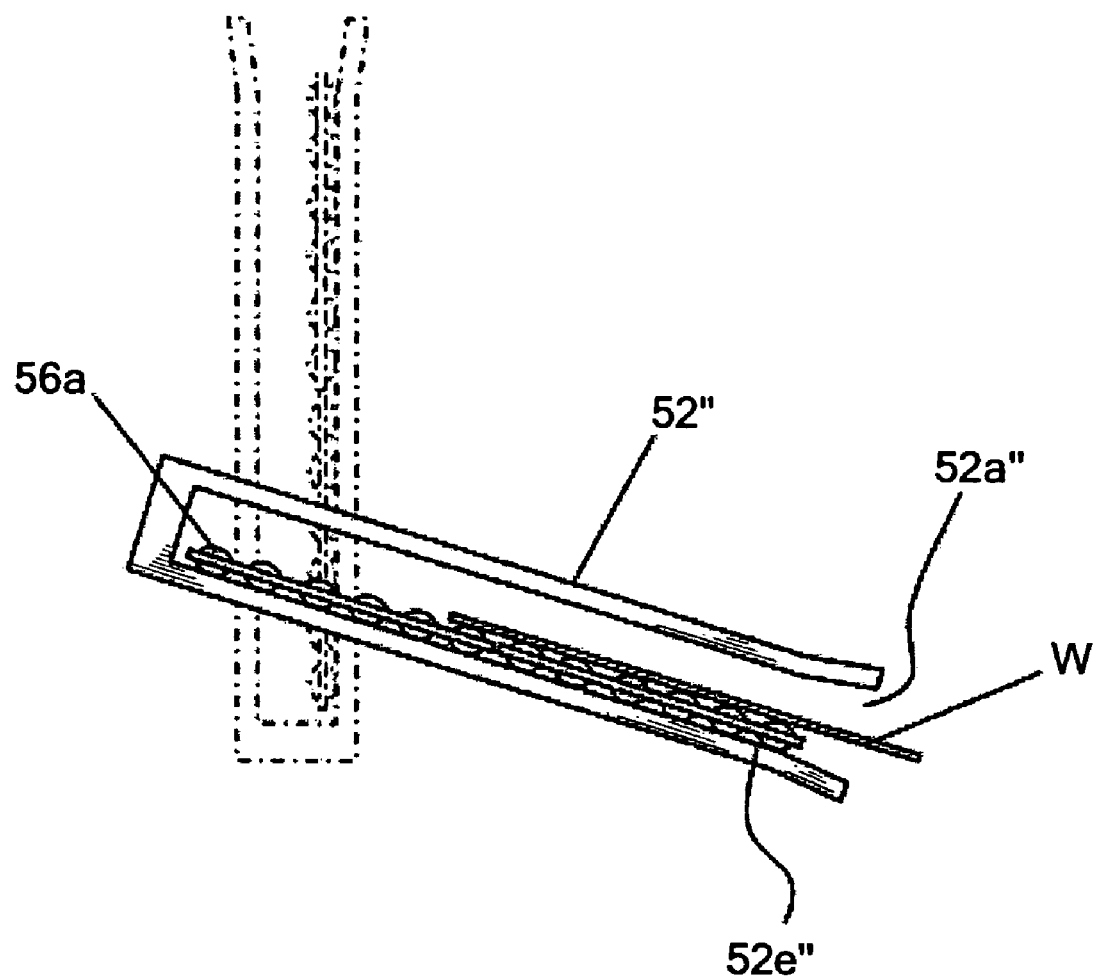
FIG. 16 shows the structure of the board loading device in other embodiment.

As shown in FIG. 16, by attaching free roller 56a without driving source to inner surface of the sidewall 52e" of the board container 52" and by setting the open area 52" the board container 52 direct to downward than horizontal direction by rotator 54, the board W can be carried out with sliding down on free roller 56a caused by force of gravity.

Furthermore, as the board container 52" shown in FIG. 16 applies for the unloading device, the board container 52" can be put in place of the board container 52 shown in FIG. 14. As a whole device, the board container 52 of FIG. 4 can be replaced by the board container 52" of FIG. 16 and the board container platform 22 of FIG. 14, and further the board supporter 60 of FIG. 4 can be replaced by the board supporter 61 of FIG. 14 with deleting the transport roller 56.

Also, in the embodiment described above, it was described that the cutout 52b on the board container 52 of the board container 52 is shaped in a longitudinal direction (in a transport direction) as shown in FIG. 5, but the present invention is not limited thereto. For example, it can be possible to form cutout in crosswise direction (perpendicular to the transport direction) which guides each rollers of the transport roller 56 shown in FIG. 4 arranged side by side in back direction against page space. In this case, the cutout 52c of the sidewall 52f is formed in crosswise direction to guide the roller, and the board container 52 having the cutout in crosswise direction is made up in the embodiment of the board unloading device arranging the board supporter 60' shown in FIG. 15.

Figure 17:
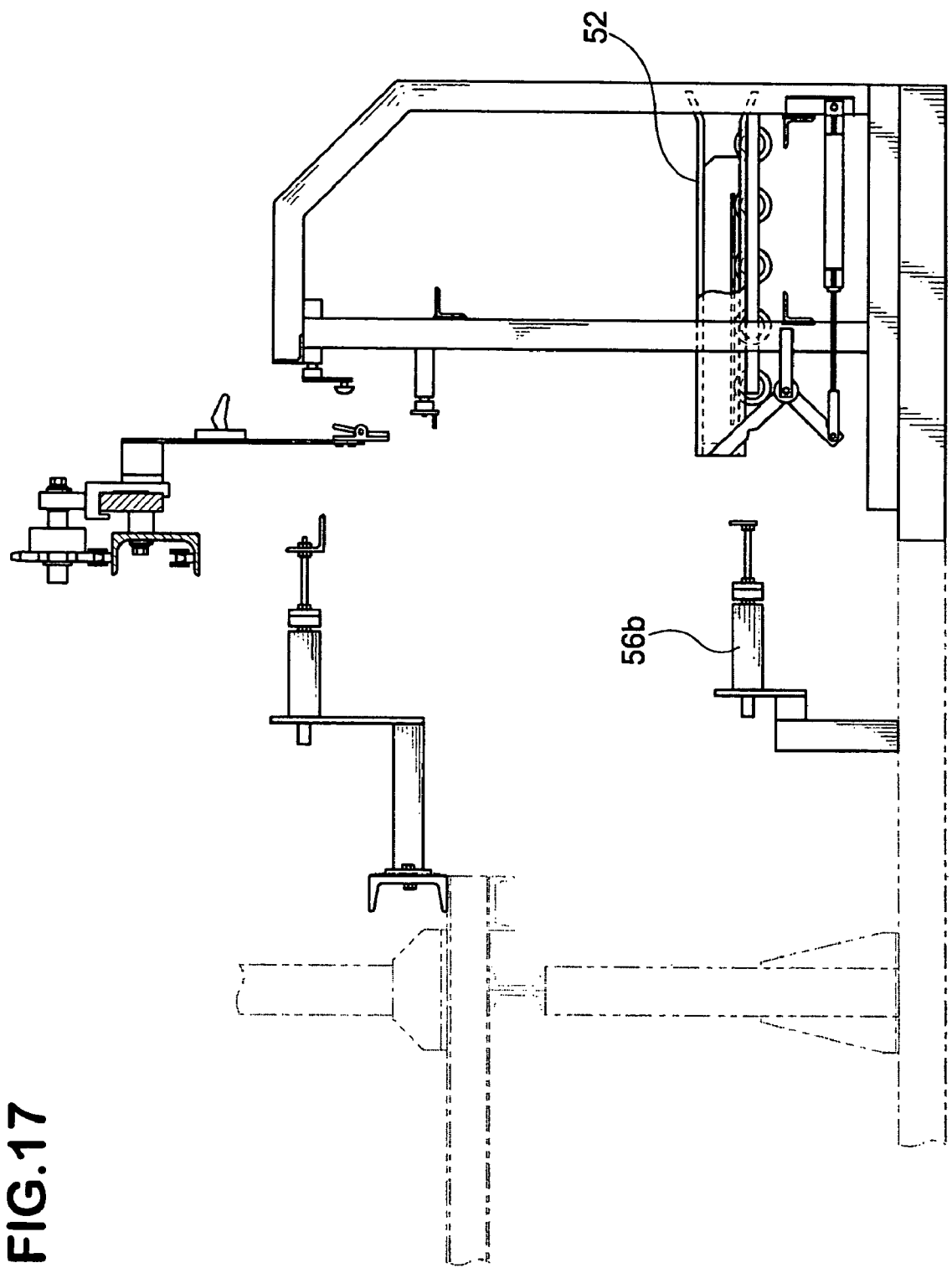
FIG. 17 shows the structure of the board loading device in other embodiment.
Figure 18:
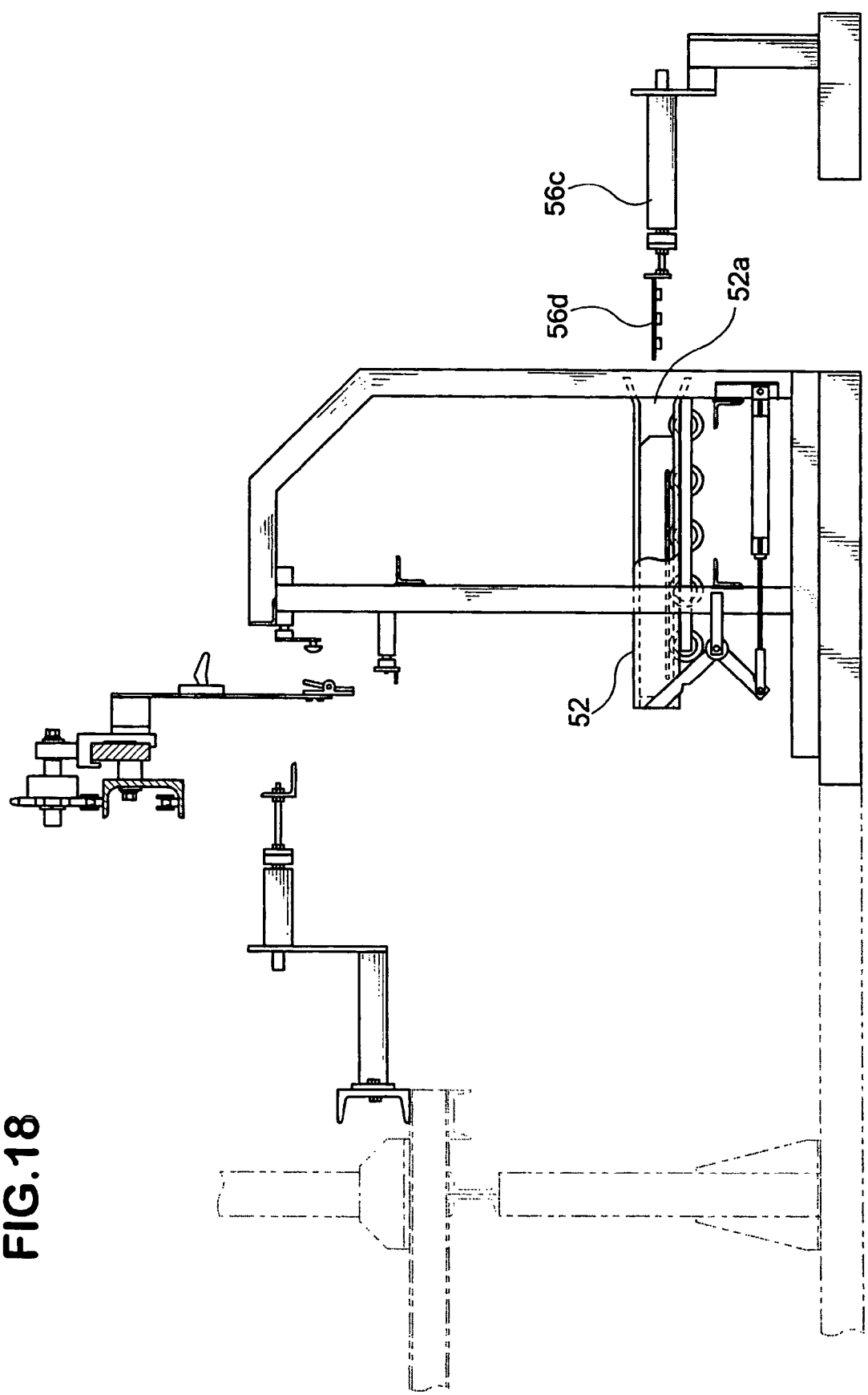
FIG. 18 shows the structure of the board loading device in other embodiment.

Also, in the embodiment described above, it was described that the transport roller 56 carries out the board W by roller which supports the board through the cutout 52b of the board container 52 and drives by driving source as shown in FIG. 1, but the present invention is not limited thereto. For example, it can be pushed out by push-out cylinder 56b arranged at left side against rotated board container 52's bottom as shown in FIG. 17. Furthermore, it can be arranged extract cylinder 56c on right side (front side of the open area) of rotated board container 52 which is driving source, and the absorber 56d attached to the extract cylinder 56c for absorbing the board W on its pad, and the extract cylinder 56c actuate the absorber 56d to go into the board container 52 through the open area 52a, and the board W is carried out by extracting from an open area 52a as shown in FIG. 18.

Also, in the embodiment described above, it was described that the board unsticker 58 of FIG. 1 moves back and forth horizontally to swing the board W by contacting, but the present invention is not limited thereto. For example, it is possible to make an impact to sidewall 52e of the board container and transport hunger 15 by cylinder shock for swinging the board W.

Also, in the embodiment described above, it was described that the board unsticker 58 is placed at only right side against the clamping position P as shown in FIG. 1, but it is possible to be placed at only left side, and both of right side and left side on drawing.

For example, as the board W sticks to fixed part 48a or movable part 48b against the clamp 48 shown in FIG. 10, it is effective to push out sticking board W from right side on drawing if it stuck to the movable part 48b, and to push out sticking board W from left side on drawing if it stuck to the fixed part 48a Also, in the embodiment described above, the board unloading device is comprised of three component parts such that a clamp opener 50, a hanger supporter 51, and a container 53, but the present invention is not limited thereto. The board unloading device has no less than the clamp opener 50.

Also, in the embodiment described above, it was described that the transport roller 56 supports the board W automatically by rotating the board container 52, but the present invention is not limited thereto. For example, the board W can be supported by the transport roller which is upraised after rotating the board container 52.

Also, in the embodiment described above, it was described that the stick-on prevention guide 52d on the inner surface of the sidewall 52f of the board container 52 prevents from sticking to the board container 52 as shown in FIG. 3C as the board W drops from the transport hanger 15, but the present invention is not limited thereto. For example, an air sprayer comprised of first air nozzle 62 and second air nozzle 64 as shown in FIG. 19 and 20 can be used instead of the stick-on prevention guide 52d.

Figure 19:
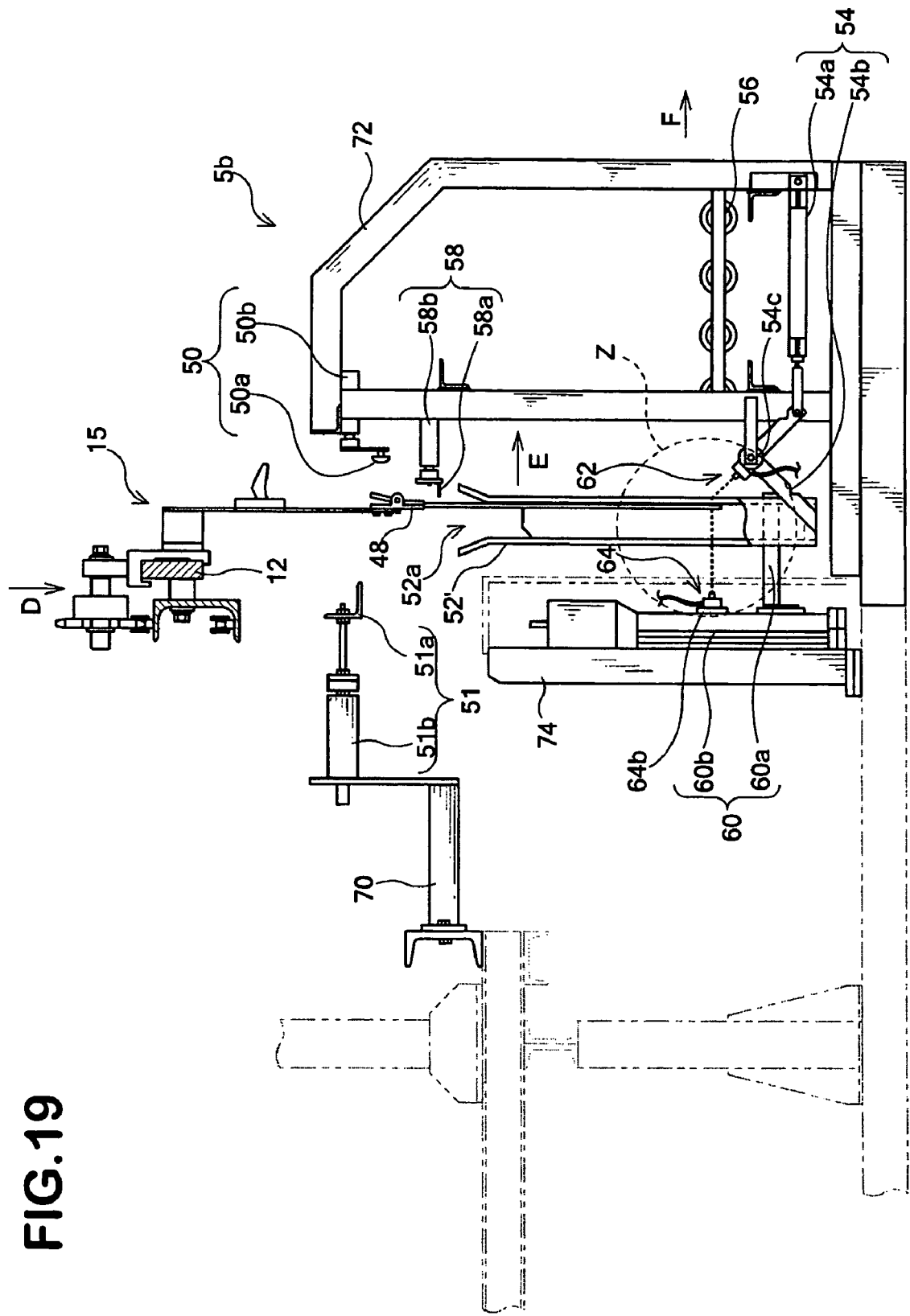
FIG. 19 shows the structure of the board loading device in other embodiment.
Figure 20:
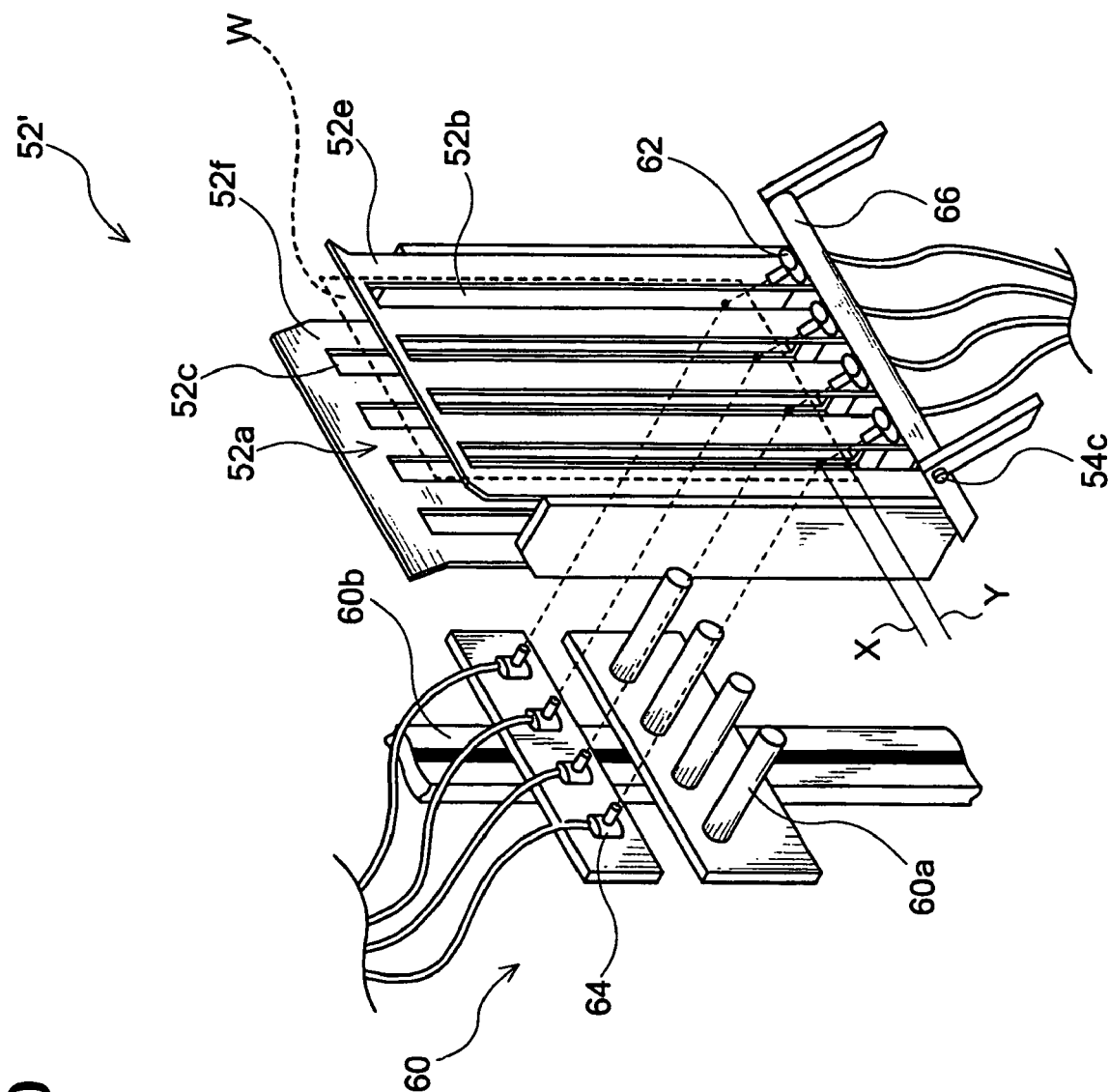
FIG. 20 shows the structure of the board loading device in other embodiment.
Figure 21:
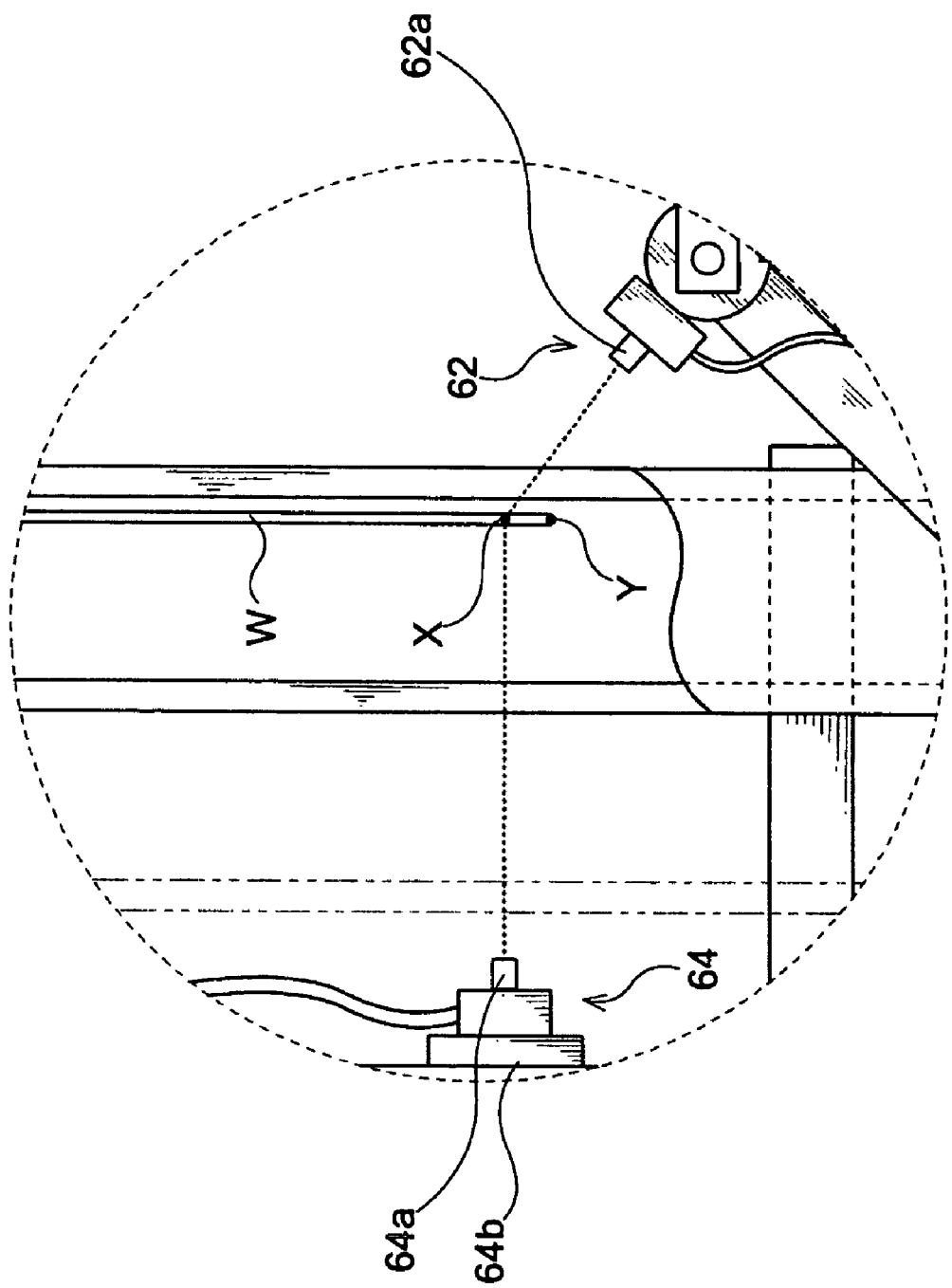
FIG. 21 shows the structure of the board loading device in other embodiment.

FIG. 19 and FIG. 20 shows condition that first air nozzle 62 and second air nozzle 64 comprising air sprayer is added further in FIG. 4 which shows the structure of the unloader 5b having the board supporter 60 and FIG. 5 which shows the structure of the board container 52 respectively. FIG. 21 shows z-portion of FIG. 19 which details the board container 52'.

As shown in FIG. 20, the board container 52' in this embodiment has cutout 52b not only on sidewall 52e (lower sidewall when rotated), has cutout 52c but also on sidewall 52f (upper sidewall when rotated).

Also, as shown in FIG. 19, on right side (base frame 72 side) of the board container 52' in drawing, four number of first air nozzles 62 (refer to FIG. 20) are arranged in that the discharge hole 62a is directed to upper direction than horizontal direction (i.e. at a slant against falling board W), and on left side (base frame 74 side) of the board container 52' in drawing, four number of second air nozzle 64 (refer to FIG. 20) are arranged in that the discharge hole 64a is directed vertically (i.e. perpendicular to the falling board W).

Further, as shown in FIG. 20, the first air nozzle 62 is attached to the fixed shaft 66 (not rolling when the board container 52 is rotated) which is arranged along the axis 54c fixed to the base frame 72 (refer to FIG. 19), and the second air nozzle 64 is attached to the spraying position adjust lift 64b, which transfer the second air nozzle 64 to predetermined height position by driving of motor or electrical actuator etc. It is desirable to prevent the board W from sticking to the board container 52' effectively, (i) adjusting the height of the first air nozzle 62 and second air nozzle 64 and discharge angle of nozzle to spray at upper position X no less than lower end Y of the board W as shown in FIG. 21 when falling of the transport hanger 15, and (ii) arranging the first air nozzle 62 and second air nozzle 64 where air is sprayed at the same position X on the both sides of the board W as shown in FIG. 20.

Referring to FIGS. 19 and 20, the operation of first air nozzle 62 and second air nozzle 64 will be described as below. Furthermore, air for first air nozzle 62 and second air nozzle 64 is supplied by using clean air in equipment and the control is done from control part by programming the motion of magnet valve.

When the transport hanger 15 falls vertically (D-direction of FIG. 19) as shown in FIG. 19, first air nozzle 62 and second air nozzle 64 start spraying before the clamp opener 50 opens the clamp 48 or at the same time of opening the clamp 48. Next, the board W drops when the clamp opener 50 unlocks clamping of the transport hanger 15, if this is not the case, the board W drops by moving board press member 58*a* of the board unsticker 58 back and forth horizontally. At this time, as air is sprayed in equaling against obverse and reverse side of the board W from both sides of outside the board container 52 through the said cutouts 52*b,* 52*c,* the board W drops smoothly in apart (floated) condition from inner surface. When the sensor (not illustrated) detects that the board W has reached at the board stopping member 60*a* of the board supporter 60, first air nozzle 62 and second air nozzle 64 stop spraying. After that, the board container 52' is rotated in E-direction of FIG. 19, and the board W is carried out horizontally (F-direction of FIG. 19) from open area 52*a.* Furthermore, the above-mentioned a series of operation is controlled by the control part (not illustrated).

Therefore, it becomes possible to house the board into the board container certainly and to solve the problem that occurs from sticking to the sidewall of the board container 52' while dropping. For example, it can be avoided such as bending and damage caused by that the board W makes contact with the board unsticker 58 when rotating of the board container 52', as upper part of the board W is sticking out from an open area of the board container 52.

Figure 23:
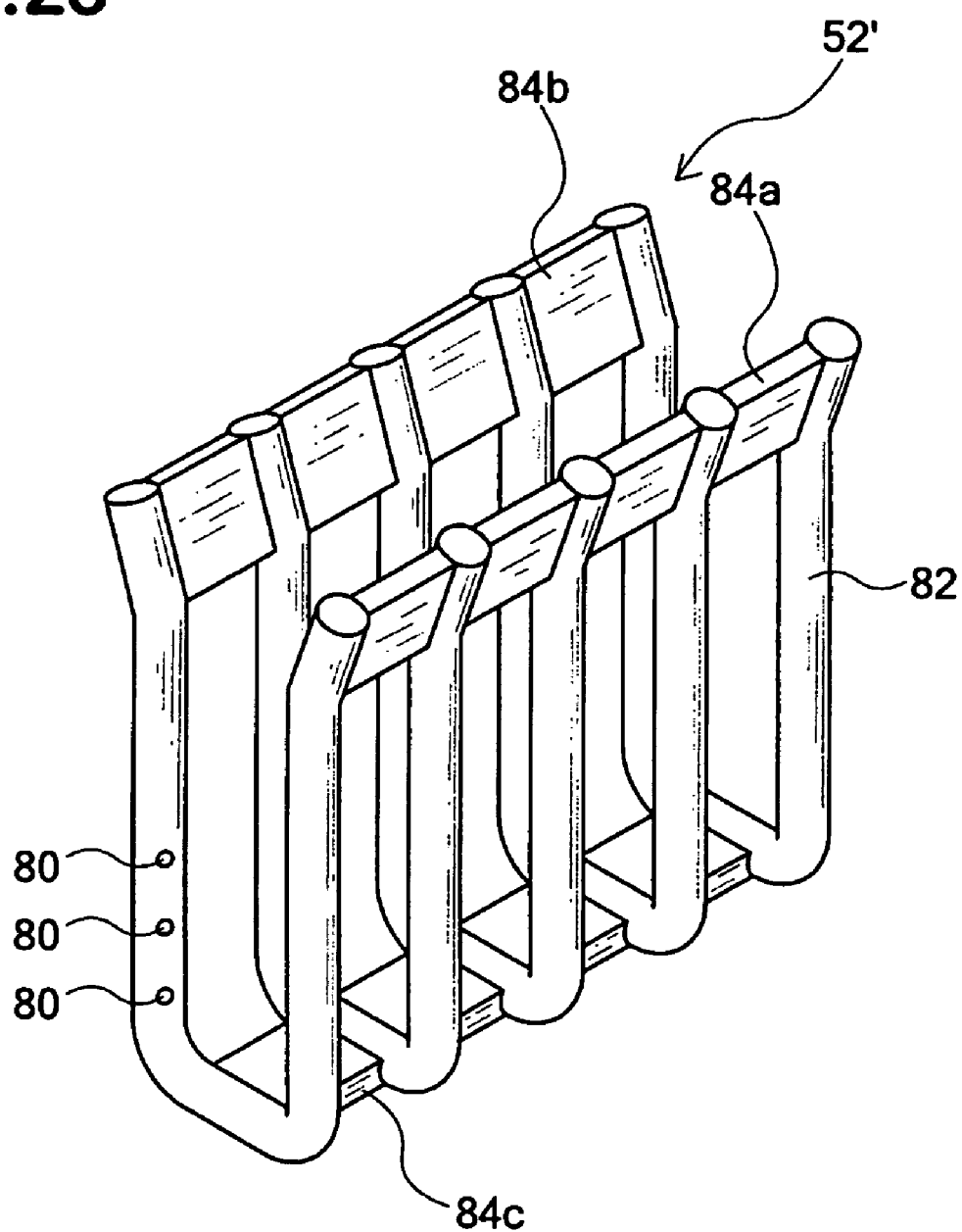
FIG. 23 shows the structure of the board loading device in other embodiment.

Also, in the embodiment described above, it was described that the first air nozzle 62 is attached to the fixed shaft 66 of the board container 52', but the position and the method is not limited thereto. For example, it can be attached to the base frame 72 directly or can be formed in a unified manner as a board container 52' by combination of pipe 82 which is formed the air-discharge hole 80 and plate member 84*a,* 84*b,* 84*c* as shown in FIG. 23.

Figure 24:
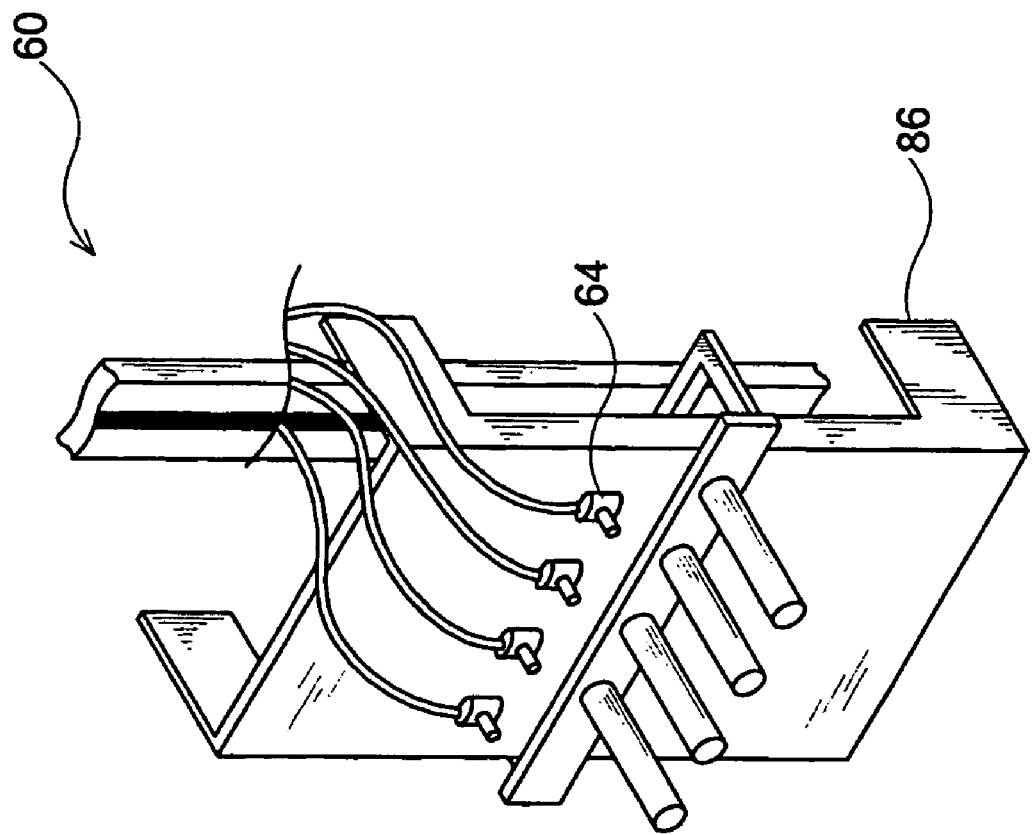
FIG. 24 shows the structure of the board loading device in other embodiment.

Also, in the embodiment described above, it was described that the second air nozzle 64 is attached to the spraying position adjust lift 64*b,* but the position and the method is not limited thereto. For example, as shown in FIG. 24, the second air nozzle 64 can be attached to the cover 86 which covers the board supporter 60.

Figure 25:
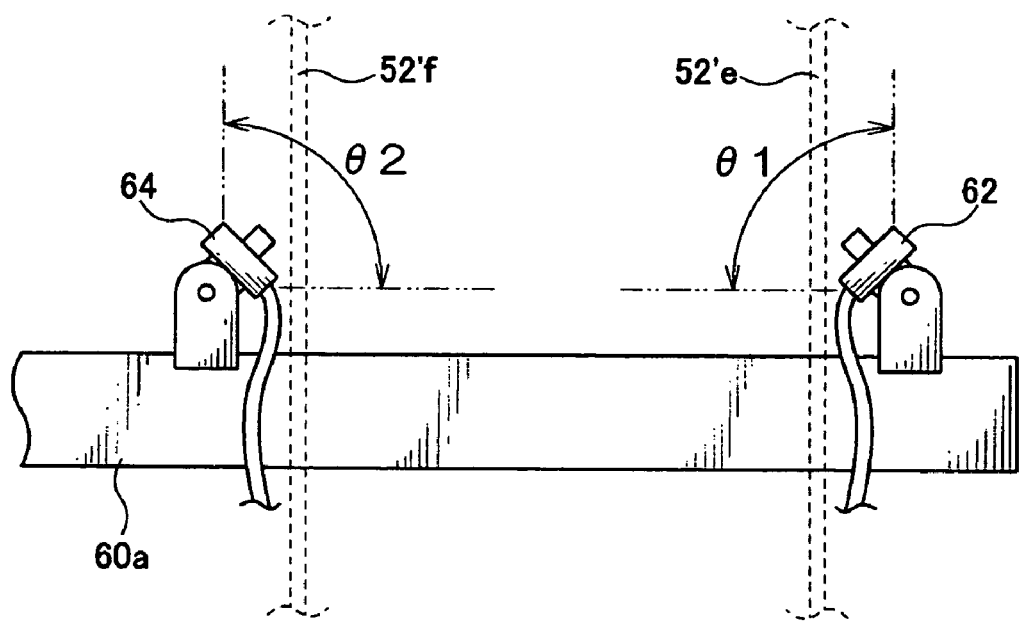
FIG. 25 shows the structure of the board loading device in other embodiment.

Also, as shown in FIG. 25, both first air nozzle 62 and second air nozzle 64 can be attached to the board stopping member 60*a* (FIG. 4). For example, as shown in FIG. 25, it can be possible to attach first air nozzle 62 and second air nozzle 64 to the board stopping member 60*a* as placed outside of the board container 52 (52*f,* 52*e*') and can be adjustable the position an air points in the movement range θ1, θ2 of the first air nozzle 62 and second air nozzle 64.

Also, in the embodiment described above, it was described that the number of the first air nozzle 62 and the second air nozzle 64 is four respectively, but these number is not limited thereto.

Also, in the embodiment described above, it was described that the spraying direction from the first air nozzle 62 is upper than horizontal direction and from second air nozzle 64 is in horizontal direction, but the direction is not limited thereto. For example, the spraying direction can be lower than horizontal direction, both the spraying direction form first air nozzle 62 and second air nozzle 64 can be than horizontal direction, or upper than horizontal direction.

Also, the angle to air and the manner how the facing air point can be set optionally based on each factor like as size, thickness, weight of the board W, and discharge rate so on.

Figure 26:
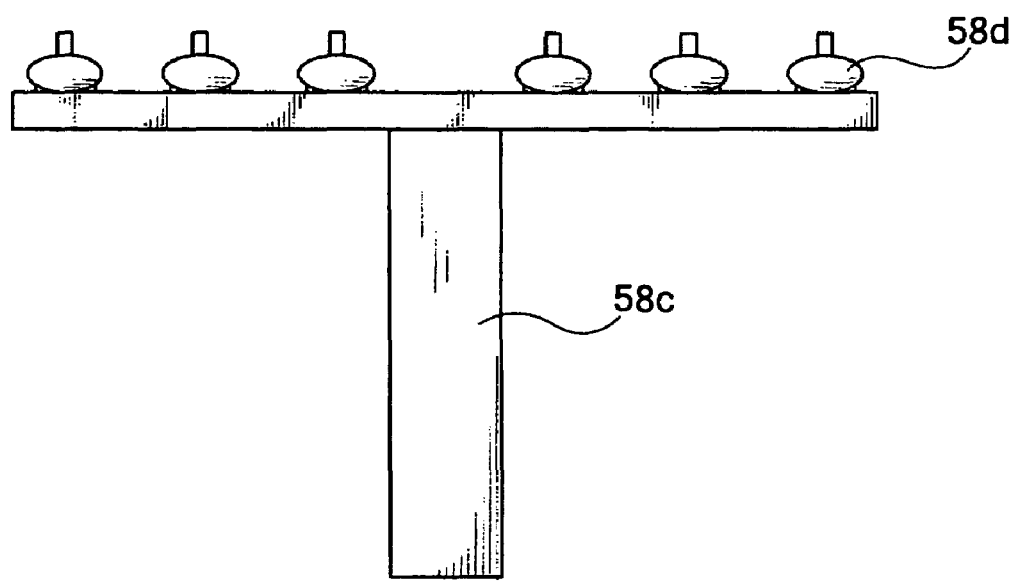
FIG. 26 shows the structure of the board loading device in other embodiment.

Also, in the embodiment described above, it was described that the board unsticker 58 is comprised of the board press member 58*a* and press cylinder 58*b* of FIG. 1, but the present invention is not limited thereto. For example, the board unsticker 58 can be configured by air nozzle, which is used as first air nozzle 62 and second air nozzle 64 in FIG. 19, 20, and further can be used for dropping the board W from clamp 48 by air pressure. As shown in FIG. 26, the board unsticker 58 is realized by that support member 58*c* and air nozzle 58*d* attached to it in place of the board press member 58*a* and board press cylinder 58*b* shown in FIG. 13.

In this case, air nozzle used as the board unsticker 58 can be placed at only right side against the clamping position P, only left side, and both of right side and left side on drawing. Also, it is possible to add air nozzle further to the board press member 58*a* and the press cylinder 58*b* as the board unsticker 58.

Figure 27:
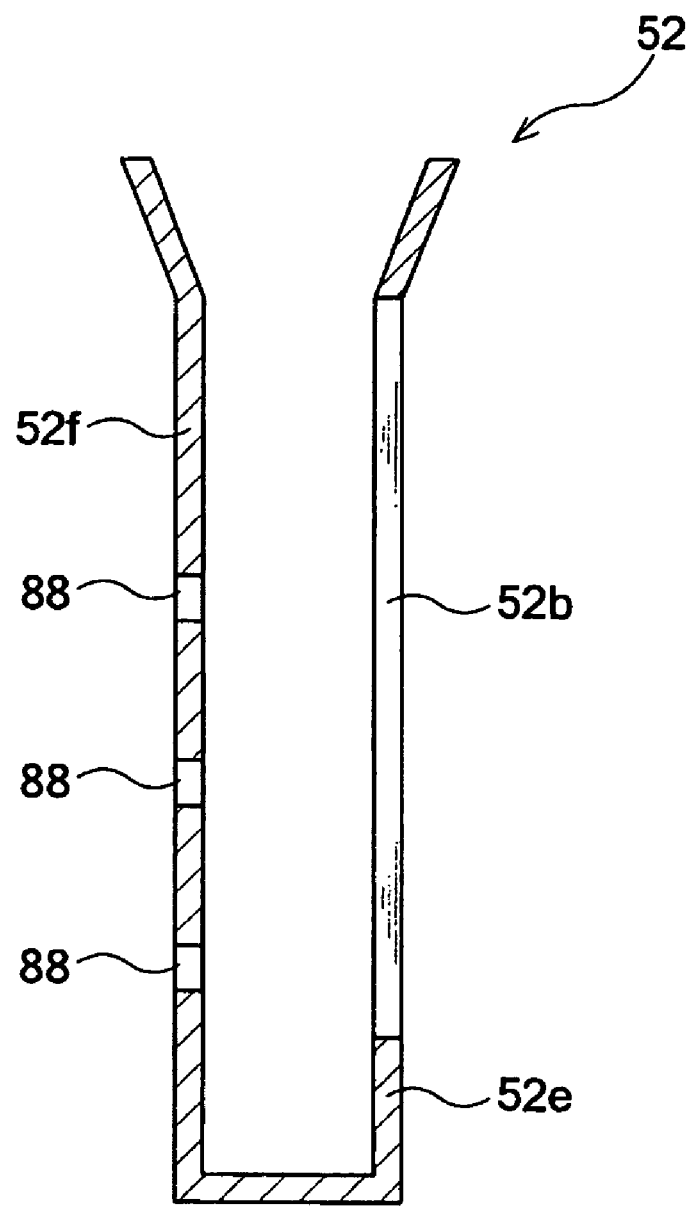
FIG. 27 shows the structure of the board loading device in other embodiment.

Furthermore, if the board container 52 does not have cutout 52*b* only in sidewall 52*e* shown in FIG. 2, it is possible to form vent hole 88 in the other sidewall 52*f* as shown in FIG. 27, which is to air from the second air nozzle 64 through.

Also, in the embodiment described above, it was described that the first air nozzle 62 is attached to the fixed shaft 66 (not rolling when the board container 52' is rotated), which is arranged along the axis 54*c* fixed to the base frame 70 (refer to FIG. 19) as shown in FIG. 20, but the present invention is not limited thereto. For example, it can be attached to the roll shaft 66' which rolls together with when the board container 52' is rotated.

Figure 28:
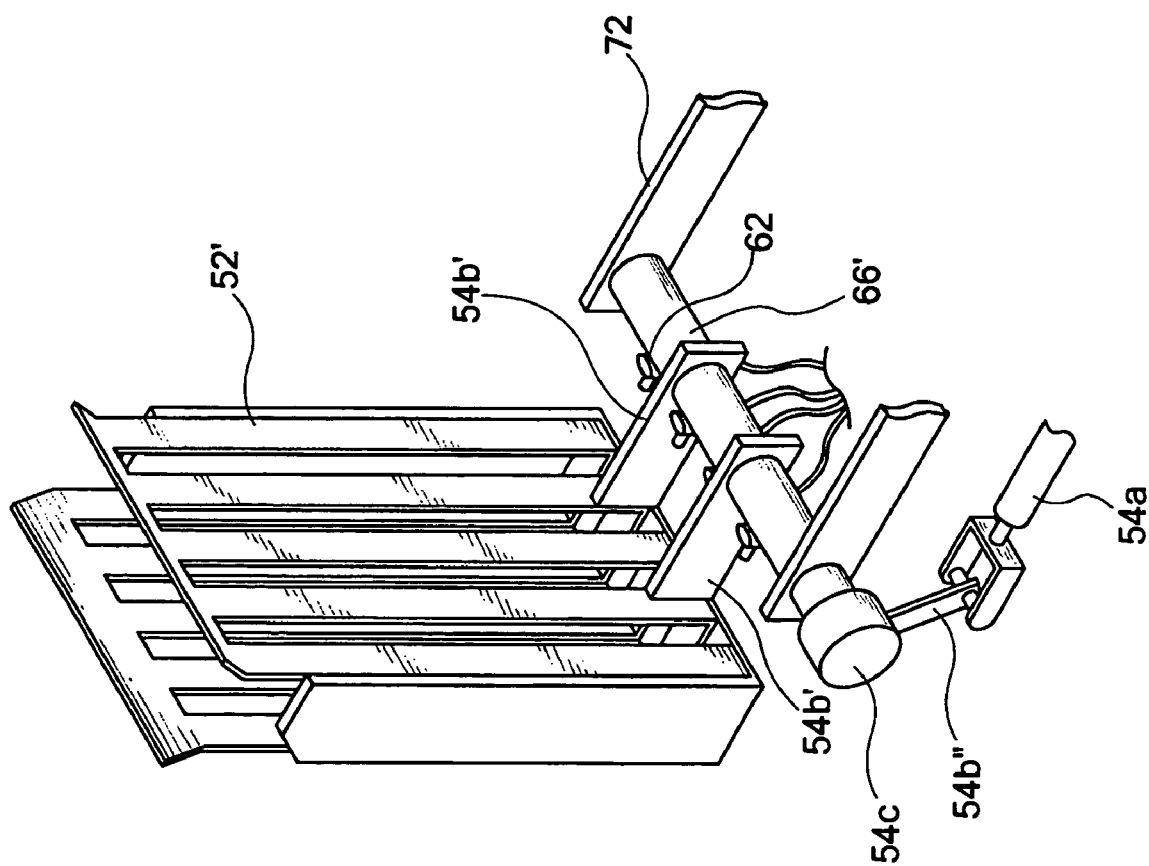
FIG. 28 shows the structure of the board loading device in other embodiment.

Also, in the embodiment described above, it was described that the rotate arm 54*b* of the board container 52 (FIG. 1 etc.) is formed by unified member of L style, but the present invention is not limited thereto. For example, rotate arm can be formed by member 54*b*' and 54*b*" respectively fixed to the roll shaft 66' as shown in FIG. 28, and the first air nozzle 62 can be attached to the roll shaft 66'. Furthermore, roll shaft 66' is rotatably against the base frame 72 in FIG. 28.

Furthermore, the board unsticker 58, the stick-on prevention guide 52*d,* and the air sprayer 62, 64, and the sensor for detecting the dropping of the board can be used by combining each other. As below, the efficiency of each combination comprised of the board unsticker 58, the stick-on prevention guide 52*d,* the air sprayer 62, 64, and the sensor for detecting the dropping of the board will be described.

The combination of the board unsticker 58 and the stick-on prevention guide 52*d* can prevent the board W from sticking to the board container 52 certainly more than the board unsticker 58 alone. The combination of the board unsticker 58 and the air sprayer 62, 64 can house the board W into the board container 52' certainly more than the board unsticker 58 alone. The combination of the board unsticker 58 and the sensor can detect that the board W is dropped into the board container 52' certainly more than the board unsticker 58 alone.

The combination of the board unsticker 58, the stick-on prevention guide 52*d,* and the air sprayer 62, 64 can prevent the board W from sticking to the board container 52 and house the board W into the board container 52' certainly more than the air sprayer 62, 64 alone.

The combination of the stick-on prevention guide 52*d* and the air sprayer 62, 64 can prevent the board W from sticking to the board container 52 certainly more than the air sprayer 62, 64 alone. The combination of the stick-on prevention guide 52*d* and the sensor can prevent the board W from sticking to the board container 52 and detect that the board W is dropped into the board container 52' certainly. The combination of the air sprayer 62, 64 and the sensor can drop the board W and detect it certainly.

The combination all of the board unsticker 58, the stick-on prevention guide 52*d,* the air sprayer 62, 64, and the sensor for detecting the dropping of the board can detect that the board W is dropped into the board container 52 certainly and house the board W into the board container 52 certainly and securely to the max.

What is claimed is:

1. A board unloading device for unloading a board from a transport hanger which is clamping the board, comprising:
    a board dropper for unlocking the board's clamping of the transport hanger; and
    a board carrier including a board container,
    wherein the board carrier rotates the board container and carries out the board from an open area of the board container housed in the board container after rotating from the open area by a board transporter, after receiving and housing the board which is unloaded by the board dropper from the transport hanger vertically through the open area,
    wherein the board container includes cutouts on a lower sidewall when the board container is rotated, and
    wherein the board transporter upholds the board housed in the board container through the cutouts after rotating and carries out the board from the open area.

2. The board unloading device according to claim 1, wherein the board carrier includes a board supporter which adjusts drop position of the board unloaded from the transport hanger.

3. A board unloading device for unloading a board from a transport hanger which is clamping the board, comprising:
    a board dropper for unlocking the board's clamping of the transport hanger; and
    a board carrier including a board container,
    wherein the board carrier rotates the board container and carries out the board from an open area of the board container, after receiving and housing the board which is unloaded by the board dropper from the transport hanger vertically through the open area,
    wherein the board dropper includes a board unsticker.

4. A board unloading device for unloading a board from a transport hanger which is clamping the board, comprising:
    a board dropper for unlocking the board's clamping of the transport hanger; and
    a board carrier including a board container,
    wherein the board carrier rotates the board container and carries out the board from an open area of the board container, after receiving and housing the board which is unloaded by the board dropper from the transport hanger vertically through the open area,
    wherein the board container includes cutouts on both lower and upper sidewalls when the board container has rotated; and
    wherein an air sprayers sprays air on both sides of the board through the cutouts, when the board dropper unlocks the board clamping of the transport hanger.

5. The board unloading device according to claim 4, wherein the air sprayers sprays air against at least above lower end of the board.

6. The board unloading device according to claim 4, wherein the board container includes a stick-on prevention guide on its inner surface.

7. A method for unloading a board from a transport hanger which is clamping the board, comprising:
    unloading the board by unlocking the board clamping of the transport hanger;
    rotating a board container that includes cutouts on a lower sidewall when the board container is rotated; and
    carrying out the board from an open area of the board container by a board transporter that upholds the board housed in the board container through the cutouts after rotating, after receiving and housing the board which is unloaded from the transport hanger vertically through the open area.

8. The board unloading device according to claim 2, wherein the board container has a stick-on prevention guide on its inner surface.

9. The board unloading device according to claim 1, wherein the board container has a stick-on prevention guide on its inner surface.

10. The board unloading device according to claim 3, wherein the board carrier has a board supporter which adjusts drop position of the board unloaded from the transport hanger.

11. The board unloading device according to claim 10, wherein the board container has a stick-on prevention guide on its inner surface.

12. The board unloading device according to claim 3, wherein the board container has a stick-on prevention guide on its inner surface.

13. The board unloading device according to claim 5, wherein the board carrier has a board supporter which adjusts drop position of the board unloaded from the transport hanger.

14. The board unloading device according to claim 13, wherein the board container has a stick-on prevention guide on its inner surface.

15. The board unloading device according to claim 4, wherein the board carrier has a board supporter which adjusts drop position of the board unloaded from the transport hanger.

16. The board unloading device according to claim 15, wherein the board container has a stick-on prevention guide on its inner surface.

17. A method for unloading a board from a transport hanger which is clamping the board, comprising:
    unloading the board by unlocking the board clamping of the transport hanger with the use of a board dropper which has a board unsticker; and
    rotating a board container and carrying out the board from an open area of the board container, after receiving and housing the board which is unloaded from the transport hanger vertically through the open area.

* * * * *